United States Patent
Ryu et al.

(10) Patent No.: US 12,278,165 B2
(45) Date of Patent: Apr. 15, 2025

(54) SEMICONDUCTOR STORAGE DEVICES AND DATA STORAGE SYSTEMS INCLUDING THE SAME

(71) Applicant: Samsung Electronics Co., Ltd., Suwon-si (KR)

(72) Inventors: Hyojoon Ryu, Hwaseong-si (KR); Bongyong Lee, Suwon-si (KR); Heesuk Kim, Suwon-si (KR); Junhee Lim, Seoul (KR); Sangyoun Jo, Suwon-si (KR); Kohji Kanamori, Seongnam-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 492 days.

(21) Appl. No.: 17/571,874

(22) Filed: Jan. 10, 2022

(65) Prior Publication Data
US 2022/0344244 A1    Oct. 27, 2022

(30) Foreign Application Priority Data
Apr. 27, 2021    (KR) .................. 10-2021-0054171

(51) Int. Cl.
*H01L 27/11519*    (2017.01)
*H01L 23/48*    (2006.01)
(Continued)

(52) U.S. Cl.
CPC .......... *H01L 23/481* (2013.01); *H10B 41/10* (2023.02); *H10B 41/27* (2023.02); *H10B 41/35* (2023.02);
(Continued)

(58) Field of Classification Search
CPC ............ H01L 23/481; H01L 24/02–09; H01L 2224/0812–08123; H10B 41/10;
(Continued)

(56) References Cited

U.S. PATENT DOCUMENTS 12,010,842 B2 *    6/2024   Tobioka ................ H10B 41/10
2014/0239375 A1    8/2014   Kim et al.
(Continued)

FOREIGN PATENT DOCUMENTS

JP    2020107673 A    7/2020
KR    20140105954 A    9/2014
(Continued)

*Primary Examiner* — Shahed Ahmed
(74) *Attorney, Agent, or Firm* — Myers Bigel, P.A.

(57) ABSTRACT

A semiconductor device includes a first structure and a second structure thereon. The first structure includes a substrate, circuit elements on the substrate, a lower interconnection structure electrically connected to the circuit elements, and lower bonding pads, which are electrically connected to the lower interconnection structure. The second structure includes a stack structure including: gate electrodes and interlayer insulating layers, which are alternately stacked and spaced apart in a vertical direction; a plate layer that extends on the stack structure; channel structures within the stack structure, separation regions, which penetrate at least partially through the stack structure, and upper bonding pads, which are electrically connected to the gate electrodes and the channel structures, and are bonded to corresponding ones of the lower bonding pads.

20 Claims, 35 Drawing Sheets

(51) Int. Cl.
  *H10B 41/10* (2023.01)
  *H10B 41/27* (2023.01)
  *H10B 41/35* (2023.01)
  *H10B 41/40* (2023.01)
  *H10B 43/10* (2023.01)
  *H10B 43/27* (2023.01)
  *H10B 43/35* (2023.01)
  *H10B 43/40* (2023.01)

(52) U.S. Cl.
  CPC ............. *H10B 41/40* (2023.02); *H10B 43/10* (2023.02); *H10B 43/27* (2023.02); *H10B 43/35* (2023.02); *H10B 43/40* (2023.02)

(58) Field of Classification Search
  CPC ........ H10B 41/27; H10B 41/35; H10B 41/40; H10B 41/50; H10B 43/00–50; G11C 16/0466–0475; G11C 27/005; G11C 11/5671
  See application file for complete search history.

(56) References Cited

U.S. PATENT DOCUMENTS

| | | |
|---|---|---|
| 2019/0371817 A1 | 12/2019 | Kim |
| 2020/0006371 A1 | 1/2020 | Huo et al. |
| 2020/0266146 A1* | 8/2020 | Nishida ............... H01L 23/5383 |
| 2020/0286876 A1 | 9/2020 | Nakaki |
| 2020/0303408 A1 | 9/2020 | Yoshimizu et al. |
| 2020/0357771 A1 | 11/2020 | Kim |
| 2020/0365614 A1 | 11/2020 | Kim |
| 2020/0373324 A1 | 11/2020 | Lee et al. |
| 2022/0052010 A1* | 2/2022 | Goda ....................... H01L 24/09 |
| 2022/0310161 A1* | 9/2022 | Pachamuthu .......... G11C 29/52 |

FOREIGN PATENT DOCUMENTS

| | | |
|---|---|---|
| KR | 20190006758 A | 1/2019 |
| KR | 20200127260 A | 11/2020 |
| KR | 20200128968 A | 11/2020 |
| KR | 20200131050 A | 11/2020 |
| KR | 20200134577 A | 12/2020 |

* cited by examiner

SEMICONDUCTOR STORAGE DEVICES AND DATA STORAGE SYSTEMS INCLUDING THE SAME

REFERENCE TO PRIORITY APPLICATION

This application claims the benefit under 35 USC 119(a) to Korean Patent Application No. 10-2021-0054171, filed Apr. 27, 2021, the disclosure of which is hereby incorporated herein by reference.

BACKGROUND

The present inventive concept relates to semiconductor devices and, more particularly, to a data storage system including highly vertically-integrated semiconductor devices.

Semiconductor devices capable of storing high-capacity data in data storage systems requiring data storage are in demand. Accordingly, a method for increasing a data storage capacity of semiconductor devices is being studied. For example, as one method for increasing data storage capacity, semiconductor devices including memory cells arranged three-dimensionally instead of memory cells arranged two-dimensionally have been proposed.

SUMMARY

Example embodiments provide a semiconductor device having improved integration, electrical characteristics and productivity. Additional embodiments provide a data storage system including a semiconductor device having improved integration, electrical characteristics and productivity.

According to example embodiments, a semiconductor device includes a first structure including a substrate, circuit elements on the substrate, a lower interconnection structure electrically connected to the circuit elements, and lower bonding pads electrically connected to the lower interconnection structure; and a second structure on the first structure. The second structure includes: (i) a stack structure including gate electrodes and interlayer insulating layers alternately stacked and spaced apart in a vertical direction, on the first structure, (ii) a plate layer disposed on the stack structure and covering an upper surface of the stack structure, (iii) channel structures, which penetrate through the stack structure, with each of the channel structures including a channel layer extending in the vertical direction and connected to the plate layer, a gate dielectric layer surrounding an outer side surface of the channel layer, and a core insulating layer covering an inner side surface of the channel layer, (iv) separation regions penetrating through the stack structure, extending in a first direction, and separating the gate electrodes in a second direction, perpendicular to the first direction, and (v) upper bonding pads electrically connected to the gate electrodes and the channel structures and bonded to the lower bonding pads. In addition, relative to an upper surface of the substrate, an upper surface of the channel layer and an upper surface of the gate dielectric layer are in contact with the plate layer, on a level higher than an uppermost gate electrode, among the gate electrodes. And, an upper surface of the core insulating layer is in contact with the plate layer, and is located at substantially the same level as or a level lower than the upper surface of the channel layer.

According to example embodiments, a semiconductor device includes a first structure including a substrate, circuit elements on the substrate, a lower interconnection structure electrically connected to the circuit elements, and lower bonding pads electrically connected to the lower interconnection structure. A second structure is also provided on the first structure. The second structure includes: (i) a plate layer on the first structure, (ii) a stack structure including gate electrodes stacked to be spaced apart from each other in a vertical direction, between the plate layer and the first structure, (iii) channel structures disposed in channel holes penetrating through the stack structure, respectively, and (iv) upper bonding pads electrically connected to the gate electrodes and the channel structures and bonded to the lower bonding pads. Each of the channel structures includes a channel layer having an inner hole penetrating through an upper surface and a lower surface in the vertical direction, a core insulating layer in the inner hole of the channel layer, and a gate dielectric layer surrounding an outer side surface of the channel layer. The upper surface of the channel layer and an upper surface of the gate dielectric layer are in contact with the plate layer. In the channel layer, a region extending from the upper surface thereof to a depth thereof overlaps at least one upper gate electrode of the gate electrodes in a horizontal direction includes polysilicon doped with an N-type impurity.

According to example embodiments, a data storage system includes a semiconductor storage device having a first structure, a second structure on the first structure, and an input/output pad electrically connected to circuit elements. The first structure includes a substrate, the circuit elements disposed on the substrate, a lower interconnection structure electrically connected to the circuit elements, and lower bonding pads electrically connected to the lower interconnection structure. A controller is provided, which is electrically connected to the semiconductor storage device through the input/output pad and is configured to control the semiconductor storage device. The second structure includes: (i) a plate layer on the first structure, (ii) a stack structure including gate electrodes stacked to be spaced apart from each other in a vertical direction, between the plate layer and the first structure, (iii) channel structures disposed in channel holes penetrating through the stack structure, and (iv) upper bonding pads electrically connected to the gate electrodes and the channel structures, and bonded to the lower bonding pads. Each of the channel structures includes a channel layer having an inner hole penetrating through an upper surface and a lower surface in the vertical direction, a core insulating layer disposed in the inner hole of the channel layer, and a gate dielectric layer surrounding an outer side surface of the channel layer. In addition, the upper surface of the channel layer and an upper surface of the gate dielectric layer are in contact with the plate layer. In the channel layer, a region extending from the upper surface thereof to a depth thereof overlaps at least one upper gate electrode of the gate electrodes in a horizontal direction, and includes polysilicon doped with an N-type impurity.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
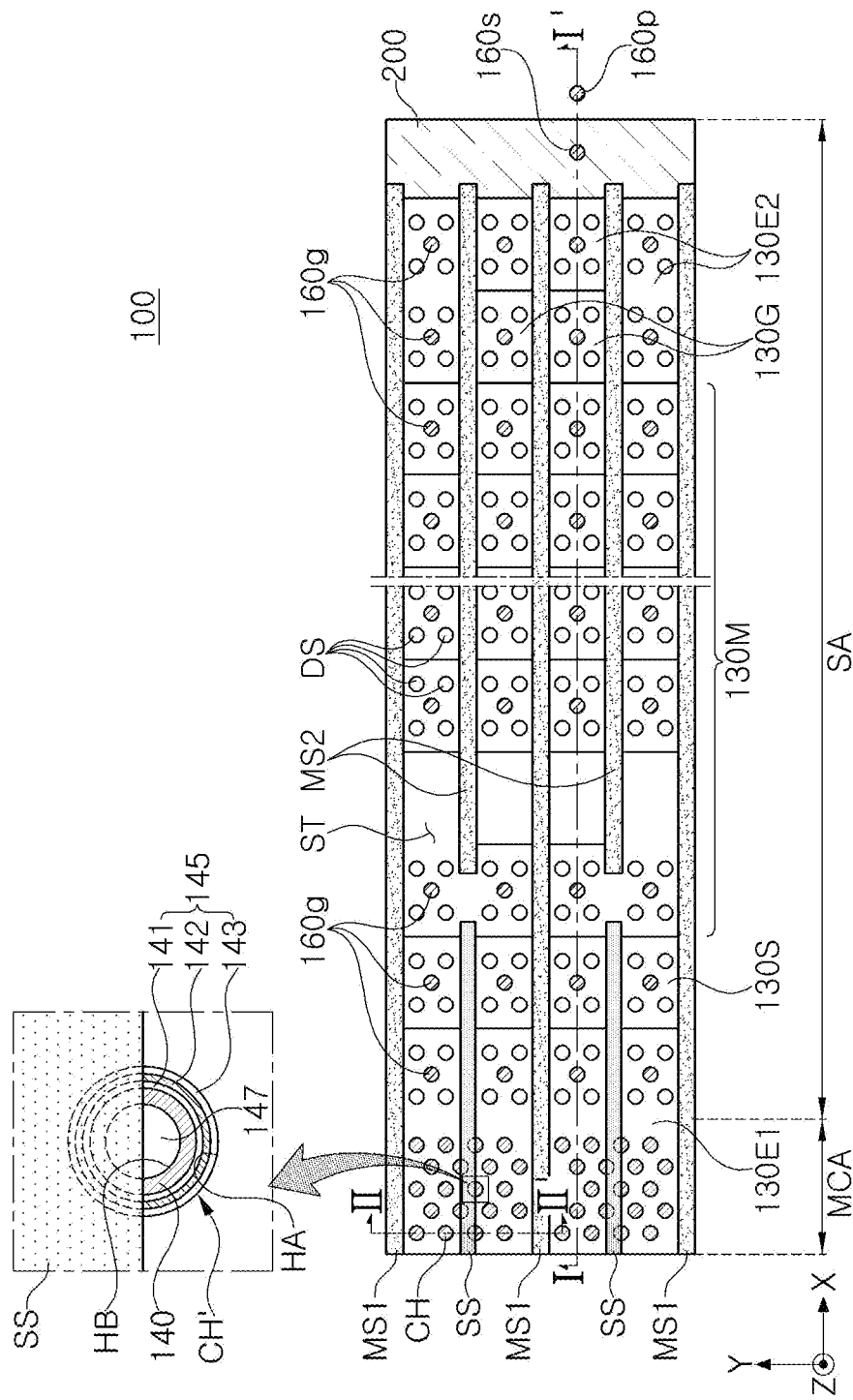
FIG. 1 is a schematic plan view of a semiconductor device according to example embodiments.

Hereinafter, example embodiments will be described with reference to the accompanying drawings. Hereinafter, terms such as 'top', 'upper', 'upper surface', 'on', 'under', 'below', 'lower surface', 'side', and the like may be understood as referring to the drawings, except for the cases being indicated by reference numerals and designated separately.

Figure 2A:
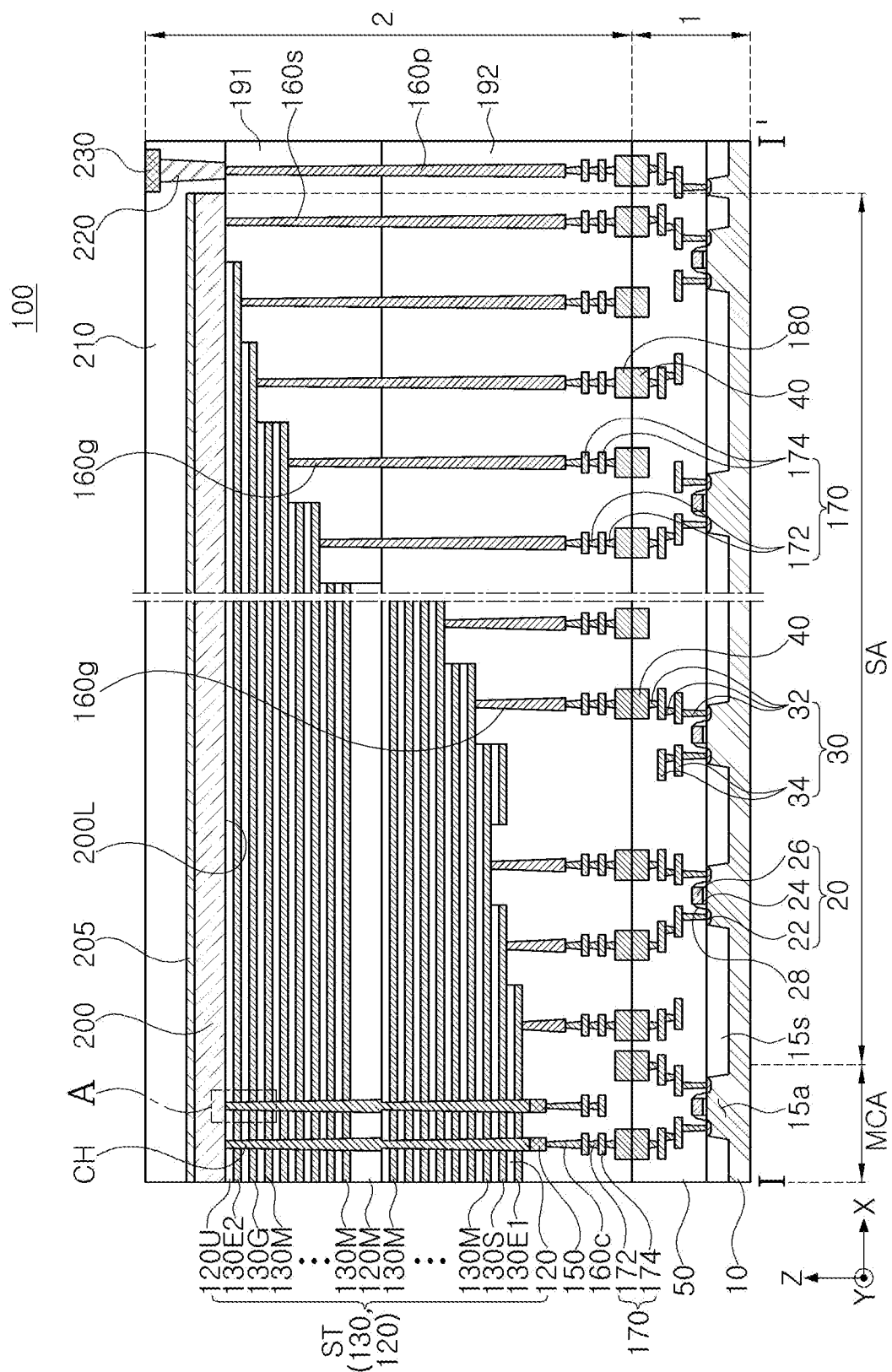
FIGS. 2A and 2B are schematic cross-sectional views of a semiconductor device according to example embodiments.
Figure 2B:
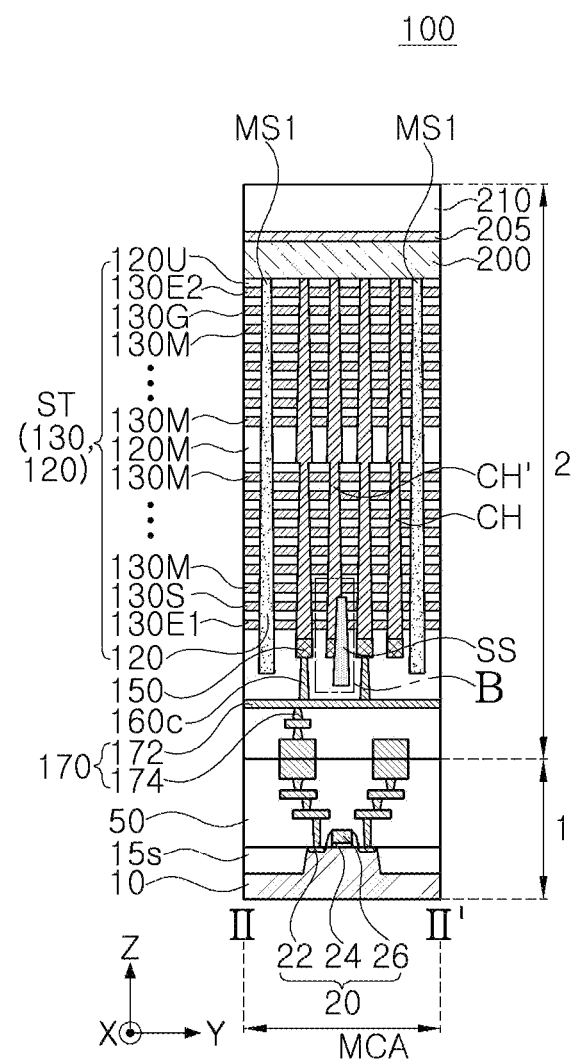
Figure 3A:
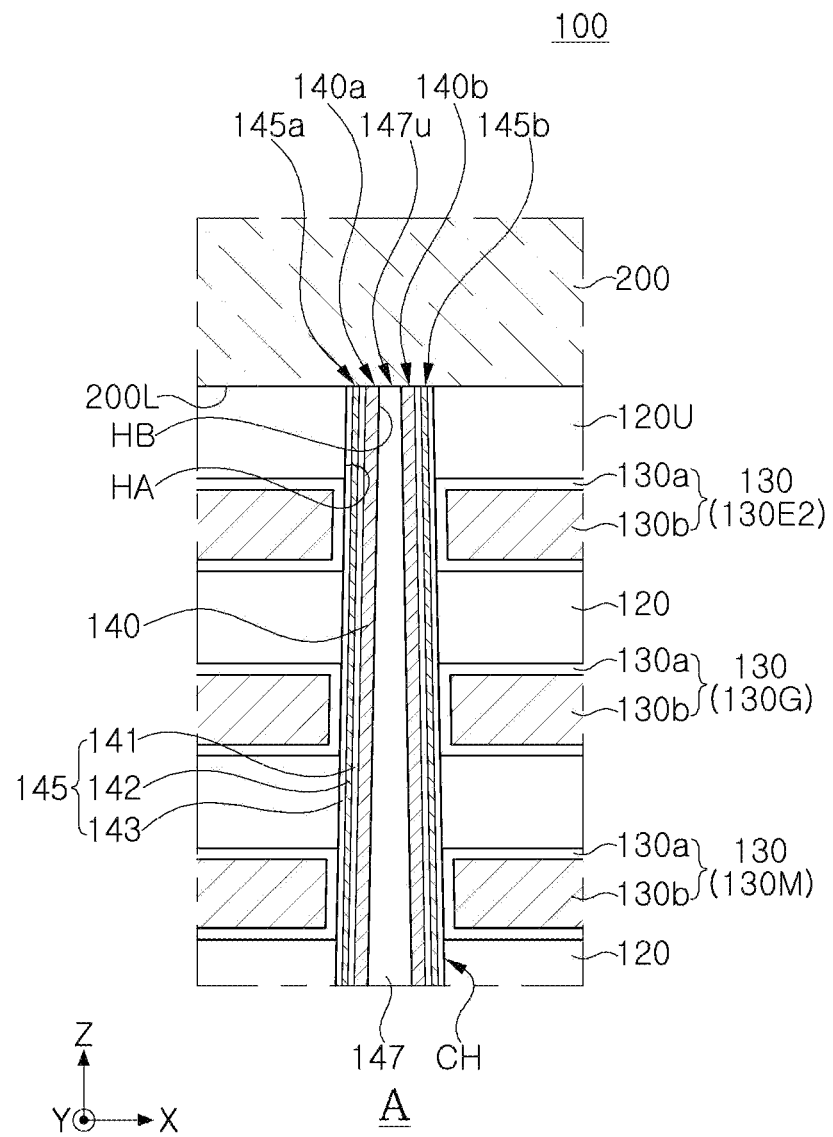
FIGS. 3A and 3B are partially enlarged views of a semiconductor device according to example embodiments.
Figure 3B:
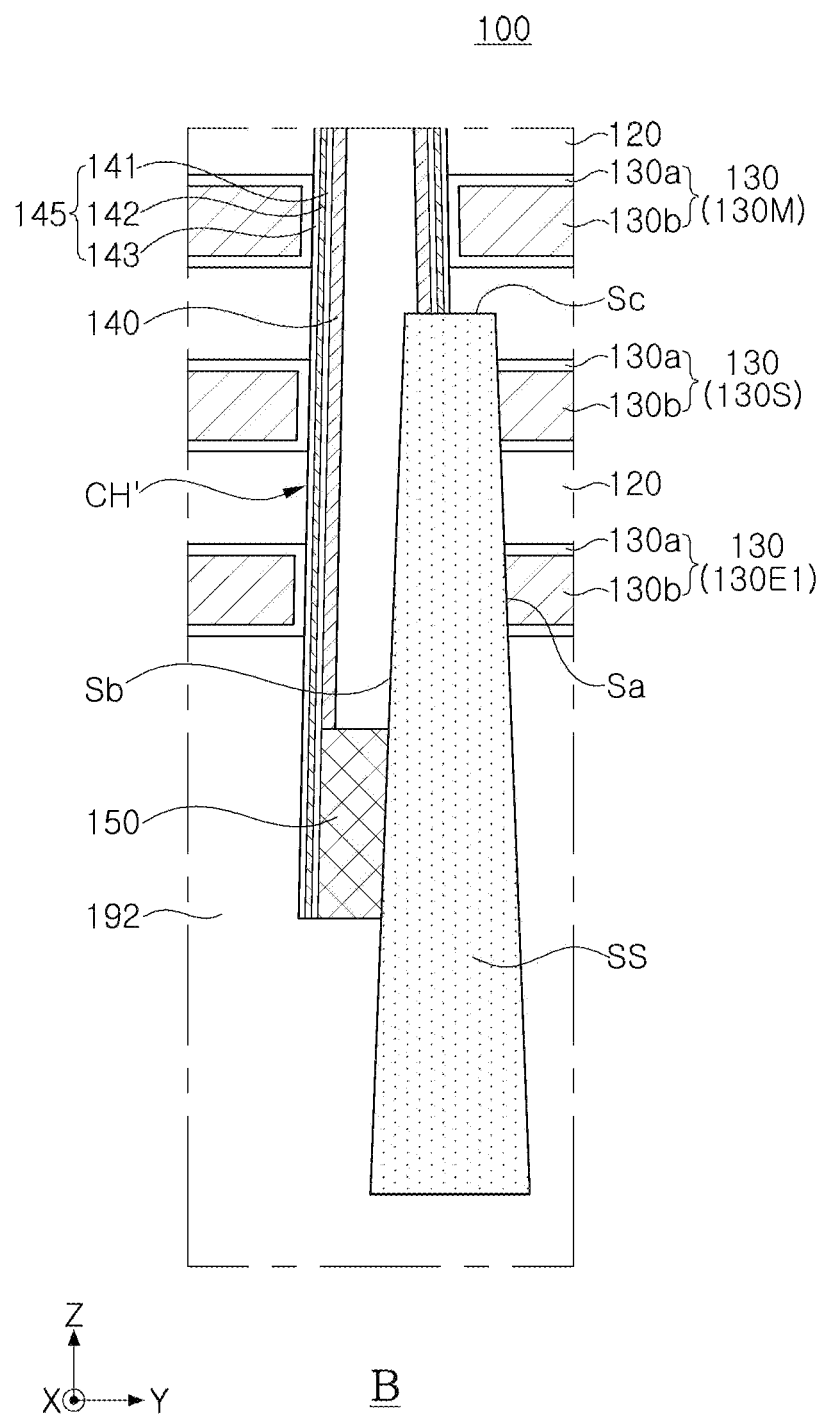

FIG. 1 is a schematic plan view of a semiconductor device according to example embodiments. FIGS. 2A and 2B are schematic cross-sectional views of a semiconductor device according to example embodiments. FIG. 2A illustrates a cross-section taken along line I-I' of FIG. 1, and FIG. 2B illustrates a cross-section taken along line II-II' of FIG. 1. FIGS. 3A and 3B are partially enlarged views of a semiconductor device according to example embodiments. FIG. 3A is an enlarged view of region 'A' of FIG. 2A, and FIG. 3B is an enlarged view of region 'B' of FIG. 2B.

Referring to FIGS. 1 to 3B, a semiconductor device 100 may include a first structure 1 including a substrate 10, and a second structure 2 including a plate layer 200. The second structure 2 may be disposed on the first structure 1. The first structure 1 is a region including a peripheral circuit region of the semiconductor device 100. The peripheral circuit region includes a row decoder, a page buffer, and other peripheral circuits. The second structure 2 includes the memory cells of the semiconductor device 100. Each of the memory cells includes the gate electrode 130 and the channel layer 140. The first structure 1 and the second structure 2 may be bonded to each other through bonding pads 40 and 180. For example, the first structure 1 and the second structure 2 may be bonded by copper (Cu)-copper (Cu) bonding.

The first structure 1 may include the substrate 10, device isolation layers 15s defining an active region 15a on the substrate 10, circuit elements 20 disposed on the substrate 10, a lower interconnection structure 30 electrically connected to the circuit elements 20, lower bonding pads 40 electrically connected to the lower interconnection structure 30, and a lower capping insulating layer 50.

The substrate 10 may include a semiconductor material, for example, such as a group IV semiconductor, a group III-V compound semiconductor, or a group II-VI compound semiconductor. The substrate 10 may be, for example, a single crystal silicon substrate. The substrate 10 may be provided as a bulk wafer or as an epitaxial layer. The device isolation layers 15s may be disposed in the substrate 10, and source/drain regions 22 including impurities may be disposed in a portion of the active region 15a.

The circuit elements 20 may each include a transistor including a source/drain region 22, a circuit gate dielectric layer 24, and a circuit gate electrode 26. The source/drain regions 22 may be disposed on both sides of the circuit gate electrode 25 in the active region 15a. The circuit gate dielectric layer 24 may be disposed between the active region 15a and the circuit gate electrode 26. Spacer layers 28 may be disposed on both sides of the circuit gate electrode 26. The circuit gate electrode 26 may include, for example, a conductive material such as tungsten (W), titanium (Ti), tantalum (Ta), or polycrystalline silicon.

The lower interconnection structure 30 may be electrically connected to the circuit elements 20. The lower interconnection structure 30 may include a lower contact 32 and a lower interconnection 34. Some of the lower contacts 32 may extend in the Z-direction to be connected to the source/drain regions 22. The lower contact 32 may electrically connect the lower interconnections 34 disposed on different levels to each other. The lower interconnection structure 30 may include a conductive material, for example, a metal material such as tungsten (W), titanium (Ti), tantalum (Ta), copper (Cu), aluminum (Al), molybdenum (Mo), ruthenium (Ru), and the like. A diffusion barrier layer formed of a metal nitride such as tungsten nitride (WN) or titanium nitride (TiN) may be disposed on the bottom and side surfaces of the lower interconnection structure 30. The number of layers and the arrangement of the lower contacts 32 and the lower interconnection 34 constituting the lower interconnection structure 30 may be variously changed.

The lower bonding pads 40 may be disposed on the lower interconnection structure 30 and may be electrically connected to the lower interconnection structure 30. The lower bonding pads 40 may be exposed from the lower capping insulating layer 50. The lower bonding pads 40 may be bonded to the upper bonding pads 180 to provide an electrical connection path between the first structure 1 and the second structure 2. The lower bonding pads 40 may include a conductive material, for example, a metal material such as tungsten (W), titanium (Ti), tantalum (Ta), copper (Cu), aluminum (Al), molybdenum (Mo), and ruthenium (Ru) or the like. A diffusion barrier layer formed of metal nitride may be further disposed on the bottom and side surfaces of the lower bonding pads 40.

The lower capping insulating layer 50 may be disposed to cover the substrate 10, the circuit devices 20, the lower interconnection structure 30, and the lower bonding pads 40. The lower capping insulating layer 50 may be formed of an insulating material such as silicon oxide or silicon nitride. The lower capping insulating layer 50 may include a plurality of insulating layers.

The second structure 2 may include a plate layer 200 on the first structure 1, a stack structure ST including gate electrodes 130 between the first structure 1 and the plate layer 200, separation regions MS1 and MS2 penetrating through the structure ST and separating the gate electrodes 130, channel structures CH penetrating through the stack structure ST and including a channel layer 140, a string separation region SS penetrating some of the gate electrodes 130, and contact plugs 160g and 160c respectively electrically connected to the gate electrodes 130 and the channel structures CH, the upper interconnection structure 170, and upper bonding pads 180 electrically connected to the upper interconnection structure 170. The second structure 2 may further include interlayer insulating layers 120 that are alternately stacked with the gate electrodes 130 and form a stack structure ST, a dummy vertical structure DS that penetrates through and supports the stack structure ST, capping insulating layers 191 and 192 covering the stack structure ST, an upper conductive layer 205 and an upper insulating layer 210 on the plate layer 200, a via 220 and a pad layer 230 electrically connected to the circuit elements 20, and contact plugs 160s and 160p electrically connected to the plate layer 200 and the pad layer 230, respectively.

The first region MCA of the plate layer 200 is a region in which the gate electrodes 130 are stacked to be spaced apart from each other in the Z-direction, and the channel structures CH are disposed, and may be a region in which memory cells are disposed. The second region SA of the plate layer 200 is an region in which the gate electrodes 130 extend to have different lengths and the gate contact plug 160g is disposed, and may be a region for electrically connecting the gate electrodes 130 to the circuit elements 20 of the first structure 1.

The plate layer 200 may be disposed on the first structure 1. The plate layer 200 may cover the upper surface of the stack structure ST. For example, the plate layer 200 may cover the uppermost interlayer insulating layer 120U of the stack structure ST. The plate layer 200 may include a semiconductor material such as silicon (Si), germanium (Ge), or silicon-germanium (SiGe). The plate layer 200 may be a layer including a conductive material. The plate layer 200 may include impurities or doped regions including impurities. The impurities may include at least one of boron (B), aluminum (Al), gallium (Ga), and indium (In) as P-type dopants, or at least one of phosphorus (P), arsenic (As), and antimony (Sb) as N-type dopants. At least a portion of the plate layer 200 may be formed of, for example, polycrystalline silicon having an N-type conductivity. In the plate layer 200, a region formed of polycrystalline silicon having an N-type conductivity may be a common source region. In an example embodiment, the plate layer 200 includes tungsten (W), titanium (Ti), tantalum (Ta), copper (Cu), aluminum (Al), molybdenum (Mo), ruthenium (Ru), and the like. The plate layer 200 may be formed of a plurality of metal layers. In the drawing, the stack structure ST may be disposed below the lower surface 200L of the plate layer 200 based on the upper surface of the substrate 10 on which the circuit elements 20 are disposed.

The gate electrodes 130 may be stacked to be spaced apart from each other in the Z-direction below the plate layer 200 to form a part of the stack structure ST. The gate electrodes 130 may extend in the X direction. The gate electrodes 130 may include erase control gate electrodes 130E1 and 130E2 constituting gates of the erase control transistors, a ground selection gate electrode 130G constituting the gate of the ground selection transistor, a string selection gate electrode 130S constituting the gate of the string selection transistor, and memory gate electrodes 130M constituting a plurality of memory cells.

The erase control gate electrodes 130E1 and 130E2 may include a first erase control gate electrode 130E1 and a second erase control gate electrode 130E2 respectively disposed below and above the stack structure ST. The erase control transistors may be transistors that perform an erase operation of memory cells using a gate induced drain leakage (GIDL) phenomenon. For example, a hole generated by the GIDL phenomenon may be injected into channels of the memory cells, and data of the memory cells may be erased by the holes injected into the channels of the memory cells. One or a plurality of first and second erase control gate electrodes 130E1 and 130E2 may be respectively disposed above and below the stack structure ST. The first erase control gate electrode 130E1 may be disposed at the bottom of the gate electrodes 130, and the second erase control gate electrode 130E2 may be disposed at the top of the gate electrodes 130.

The string selection gate electrode 130S may be disposed between the first erase control gate electrode 130E1 and the memory gate electrodes 130M. The ground selection gate electrode 130G may be disposed between the second erase gate electrode 130E2 and the memory gate electrodes 130M. One or a plurality of string selection gate electrodes 130S and ground selection gate electrodes 130G may be disposed, respectively. The number of memory gate electrodes 130M may be determined according to the storage capacity of the semiconductor device 100.

The gate electrodes 130 may extend from the first region MCA to the second region SA at different lengths to form a stepped structure in the form of a step. As illustrated in FIG. 2A, the gate electrodes 130 may form a stepped structure between the gate electrodes 130 in the X-direction, and may be disposed to have a stepped structure in the Y-direction as well. Due to the step structure, in the gate electrodes 130, the upper gate electrode 130 extends longer than the lower gate electrode 130 with respect to the upper surface of the substrate 10, and the gate electrodes 130 may include pad regions exposed downwardly from the interlayer insulating layers 120. The gate electrodes 130 may be respectively connected to the gate contact plugs 160g in the pad regions.

The gate electrodes 130 may be disposed to be separated from each other in the Y direction by the separation region MS1 extending in the X direction. The gate electrodes 130 between the pair of separation regions MS1 may form one memory block, but the scope of the memory block is not limited thereto. The gate electrodes 130 may include a first layer 130a and a second layer 130b, respectively. The first layer 130a may cover the upper and lower surfaces of the second layer 130b and may extend between the channel structure CH and the second layer 130b. The first layer 130a may include a high-k material such as aluminum oxide (AlO), and the second layer 130b may include titanium (Ti), titanium nitride (TiN), tantalum (Ta), tantalum nitride (TaN), tungsten (W), and tungsten nitride (WN). In some embodiments, the gate electrodes 130 may include polycrystalline silicon or a metal-semiconductor compound.

The interlayer insulating layers 120 may be disposed between the gate electrodes 130, and together with the gate electrodes 130 may form a stack structure ST. Like the gate electrodes 130, the interlayer insulating layers 120 may be spaced apart from each other in the Z-direction and may be disposed to extend in the X direction. The interlayer insulating layers 120 may include an insulating material such as silicon oxide or silicon nitride.

The stack structure ST may include a lower stack structure and an upper stack structure on the lower stack structure. The gate electrodes 130 of the lower stack structure may form a first gate stacked group, and the gate electrodes 130 of the upper stack structure may form a second gate stacked group. In some embodiments, the lowermost interlayer insulating layer 120M of the upper stack structure may have a greater thickness than other interlayer insulating layers 120.

The separation regions MS1 and MS2 may be disposed to extend in the X-direction through the stack structure ST of the gate electrodes 130. The separation regions MS1 and MS2 may be disposed parallel to each other. The separation regions MS1 and MS2 may penetrate the entire gate electrodes 130 of the stack structure ST to be connected to the plate layer 200. The separation regions MS1 and MS2 may space the gate electrodes 130 apart in the Y-direction. With respect to the upper surface of the substrate 10, lower surfaces of the separation regions MS1 and MS2 may be positioned at a lower level than the lower surfaces of the channel structures CH and higher than the lower surfaces of the string separation region SS. The first separation regions MS1 may extend one by one along the X-direction, and the second separation regions MS2 may intermittently extend between the pair of first separation regions MS1 or may be disposed only in some regions. However, in embodiments, the arrangement order and number of the first and second separation regions MS1 and MS2 are not limited to those illustrated in FIG. 1. The separation regions MS1 and MS2 may be formed of an insulating material, for example, silicon oxide.

As illustrated in FIG. 1, the channel structures CH may each form one memory cell string, and may be disposed to be spaced apart from each other while forming rows and columns in the first region MCA. The channel structures CH may be disposed to form a grid pattern or may be disposed in a zigzag shape in one direction. The channel structures CH may pass through the stack structure ST and may extend in the Z-direction. The channel structures CH may be disposed in channel holes HA penetrating through the stack structure ST, respectively, and may have a columnar shape and may have an inclined side of which a width becomes narrower as it approaches the plate layer 200 according to an aspect ratio.

Each of the channel structures CH may include vertically stacked first and second channel structures. The channel structure CH has a shape in which a first channel structure penetrating through the upper stack structure of the gate electrodes 130 and a second channel structure penetrating through the lower stack structure of the gate electrodes 130 are connected, and may have a bent portion due to a difference in widths in the connection region. For example, the channel structure CH may have a bent portion on a level between the uppermost gate electrode 130 of the lower stack structure and the lowermost gate electrode 130 of the upper stack structure. However, according to embodiments, the number of channel structures stacked along the Z-direction may be variously changed.

A channel layer 140 may be disposed in the channel structures CH. In the channel structures CH, the channel layer 140 may be formed in an annular shape surrounding the inner core insulating layer 147. The core insulating layer 147 may cover the inner side surface of the channel layer 140. For example, the channel layer 140 may have an inner hole HB penetrating through the upper surfaces 140a and 140b and the lower surface in the Z-direction, and the core insulating layer 147 may be disposed in the inner hole HB of the channel layer 140. The width of the inner hole HB may be smaller than the width of the channel hole HA. The channel layer 140 may be connected to the plate layer 200 at an upper end with respect to the upper surface of the substrate 10. The channel layer 140 may include a semiconductor material such as polycrystalline silicon or single crystal silicon.

The gate dielectric layer 145 may be disposed between the gate electrodes 130 and the channel layer 140. The gate dielectric layer 145 may surround an outer surface of the channel layer 140. The gate dielectric layer 145 may include a tunneling layer 141, an information storage layer 142, and a blocking layer 143 sequentially stacked from the channel layer 140. The tunneling layer 141 may tunnel charges to the information storage layer 142, and may include, for example, silicon oxide ($SiO_2$), silicon nitride ($Si_3N_4$), silicon oxynitride (SiON), or a combination thereof. The information storage layer 142 may be a charge trapping layer or a floating gate conductive layer. The blocking layer 143 may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

As illustrated in FIG. 3A, in the channel structure CH, the upper surfaces 140a and 140b of the channel layer 140 and the upper surfaces 145a and 145b of the gate dielectric layer 145 may be in contact with the plate layer 200 on a level higher than an uppermost gate electrode 130E2 among the gate electrodes 130. In this specification, a "level" may be defined based on the upper surface of the substrate 10. The upper surface 147u of the core insulating layer 147 may contact the plate layer 200 in the inner hole HB and may be positioned on substantially the same level as the upper surfaces 140a and 140b of the channel layer 140. The upper surfaces 140a and 140b of the channel layer 140 and the upper surfaces 145a and 145b of the gate dielectric layer 145 may be positioned on substantially the same level. In this specification, "substantially the same" means the same or a case where there is a difference in the range of deviations occurring in the manufacturing process, and even when the expression "substantially" is omitted, it may be interpreted as the same meaning.

As illustrated in FIG. 3A, in the channel layer 140 of one channel structure CH, a region extending from the upper surfaces 145a and 145b to a depth thereof overlapping the upper gate electrode 130 of the gate electrodes 130 in a horizontal direction may include polycrystalline silicon doped with an N conductivity type. The upper region including the upper surfaces 145a and 145b of the channel layer 140 may include polycrystalline silicon doped with N conductivity type, and may extend from the upper surfaces 145a and 145b of the channel layer 140 in a direction away from the lower surface 200L of the plate layer 200 and at least partially overlap the second erase control gate electrode 130E2 in the horizontal direction. When the plate layer 200 is a semiconductor material layer including impurities, at least one region of the channel layer 140 horizontally overlapping the second erase control gate electrode 130E2 may include the same conductivity-type impurities as the impurity of the plate layer 200. In the erase control transistor including the uppermost second erase control gate electrode 130E2, a junction overlap may be stably formed to a target depth, and a sufficient amount of GI DL current may be generated during an erase operation. Accordingly, the erase operation efficiency of the memory cells may be improved.

The channel pad 150 may be disposed at the lower end of the channel structure CH with respect to the upper surface of the substrate 10 to be connected to the lower surface of the channel layer 140. The channel pad 150 may cover the lower surface of the channel layer 140 and the lower surface of the core insulating layer 147. The channel pads 150 may include a semiconductor material and impurities. For example, the channel pads 150 may include polycrystalline silicon having an N conductivity type. In the channel layer 140 of one channel structure CH, a region extending from the lower surface to a depth overlapping with at least one lower gate electrode 130 of the gate electrodes 130 in the horizontal direction may include polycrystalline silicon doped with the same conductivity type as the channel pad 150. At least one region of the channel layer 140 that horizontally overlaps the first erase control gate electrode 130E1 may include an impurity of the same conductivity type as that of the channel pad 150.

At least one of the channel structures CH' may be disposed to overlap the string separation region SS in the Z-direction as illustrated in FIGS. 1 and 3B. The string separation region SS may partially cut the at least one channel structure CH'. The string separation region SS may contact at least one of the channel pad 150, the channel layer 140, the gate dielectric layer 145, and the core insulating layer 147 of the at least one channel structure CH'. At least one channel structure CH' may be partially cut by the string separation region SS to have an asymmetrical cross-section. As illustrated in FIG. 1, by disposing the string separation region SS and at least one channel structure CH' to overlap each other, the channel structures CH may be more densely disposed between the pair of first separation regions MS1. Since the depth of the doped region may be controlled by an ion implantation process (refer to FIG. 13B) at the upper end of the at least one channel structure CH' as illustrated in FIG. 3A, a decrease in the efficiency of the GI DL erasing operation of the lower end of the string separation region SS may be compensated.

The string separation region SS may pass through at least one lower gate electrode 130 including the lowest gate electrode 130E1 between the first separation regions MS1. The string separation region SS may separate the string selection gate electrode 130S and the first erase control gate electrode 130E1 in the Y-direction, respectively. The string separation region SS may extend from the first region MCA to a part of the second region SA along the X-direction. The string separation region SS may be disposed to overlap the at least one channel structure CH'. However, the present inventive concept is not limited thereto, and the at least one channel structure CH' cut by the string separation region SS may not be disposed. According to an embodiment, a dummy channel structure penetrating through the string separation region SS and having a structure similar to that of the channel structure CH may be disposed. According to the arrangement of the channel structure CH on the plane, the arrangement relationship between the channel structure CH and the string separation region SS may be variously changed.

The string separation region SS may include an upper surface Sc and a first surface Sa and a second surface Sb positioned on opposite sides of each other. The first surface Sa may contact the first erase control gate electrode 130E1 and the string selection gate electrode 130S among the gate electrodes 130. The second surface Sb may contact the channel pad 150 and the core insulating layer 147 of the at least one channel structure CH', but is not limited thereto. Based on the upper surface of the substrate 10, the upper surface of the string separation region SS may be positioned at a level between the upper surface of the string selection gate electrode 130S and the lower surface of the memory gate electrode 130M thereon. The lower surface of the channel structure CH may be located at a higher level than the lower surface of the string separation region SS, and may be located at a higher level than the lower surface of the separation regions MS1 and MS2.

The dummy vertical structure DS may be disposed in the second region SA and may have the same or similar structure to the channel structure CH, but may not perform a substantial function in the semiconductor device 100. The dummy vertical structure DS may serve as a support structure to improve structural stability of the stack structure ST. As illustrated in FIG. 1A, the dummy vertical structure DS may be disposed in rows and columns in pad regions of the gate electrodes 130 in the second region SA. In an example embodiment, the dummy vertical structure DS may have a structure different from that of the channel structure CH, and for example, an inside thereof may be formed of an insulating material such as silicon oxide.

The contact plugs 160g, 160c, 160s, and 160p may extend in the Z-direction and may be electrically connected to the circuit elements 20 through the upper interconnection structure 170. The contact plugs 160g, 160c, 160s, and 160p may have sides that are inclined to decrease in width from the bottom to the top according to the aspect ratio. The contact plugs 160g, 160c, 160s, and 160p may include gate contact plugs 160g, channel contact plugs 160c, source contact plug 160s, and peripheral contact plug 160p. The gate contact plugs 160g may be connected to the pad regions of the gate electrodes 130 in the second region SA. The channel contact plugs 160c may be connected to the channel pad 150 of the channel structures CH in the first region MCA. The source contact plug 160s may be disposed to be spaced apart from the stack structure ST and may be connected to the plate layer 200. The peripheral contact plug 160p may be electrically connected to the pad layer 230 and the circuit elements 20 of the first structure 1. The contact plugs 160g, 160c, 160s, and 160p may be formed of a conductive material, for example, tungsten (W), titanium (Ti), tantalum (Ta), copper (Cu), aluminum (Al), or molybdenum (Mo), and a metal material such as ruthenium (Ru). A diffusion barrier layer formed of a metal nitride may be further disposed on top and side surfaces of the contact plugs 160g, 160c, 160s, and 160p.

The upper interconnection structure 170 may be electrically connected to the contact plugs 160g, 160c, 160s, and 160p. The upper interconnection structure 170 may include an upper contact 172 and an upper interconnection 174. The upper contact 172 may electrically connect the upper interconnections 174 disposed on different levels to each other. The upper interconnection structure 170 may include a conductive material, for example, a metal material such as tungsten (W), titanium (Ti), tantalum (Ta), copper (Cu), aluminum (Al), molybdenum (Mo), ruthenium (Ru), and the like. A diffusion barrier layer formed of a metal nitride such as tungsten nitride (WN) or titanium nitride (TiN) may be disposed on the upper surface and side surfaces of the upper interconnection structure 170. The number of layers and the arrangement shape of the upper contact 172 and the upper interconnection 174 constituting the upper interconnection structure 170 may be variously changed.

The upper bonding pads 180 may be disposed below the upper interconnection structure 170 and may be electrically connected to the upper interconnection structure 170. The upper bonding pads 180 may be exposed from the second capping insulating layer 192. The upper bonding pads 180 may be bonded to the lower bonding pads 40. The upper bonding pads 180 may include a conductive material, for example, a metal material such as tungsten (W), titanium (Ti), tantalum (Ta), copper (Cu), aluminum (Al), molybdenum (Mo), ruthenium (Ru), and the like. A diffusion barrier layer formed of a metal nitride may be further disposed on top and side surfaces of the upper bonding pads 180.

The first and second capping insulating layers 191 and 192 may be disposed to cover the stack structure ST. The first and second capping insulating layers 191 and 192 may be formed of an insulating material such as silicon oxide or silicon nitride. Each of the first and second capping insulating layers 191 and 192 may include a plurality of insulating layers.

The upper conductive layer 205 may cover an upper surface of the plate layer 200. The upper conductive layer 205 may be formed of a metal-semiconductor compound such as tungsten silicide (WSi), titanium silicide (TiSi), or tantalum silicide (TaSi), a metal nitride such as tungsten nitride (WN) or titanium nitride (TiN), or a metal material such as tungsten (W), titanium (Ti), tantalum (Ta), aluminum (Al), or copper (Cu). In some embodiments, the upper conductive layer 205 may be omitted.

The upper insulating layer 210 may be disposed on the plate layer 200 and the upper conductive layer 205. The upper insulating layer 210 may be disposed to cover the side surface of the plate layer 200. A via 220 penetrating through a portion of the upper insulating layer 210 and connected to the peripheral contact plug 160p may be disposed outside the plate layer 200. A pad layer 230 may be disposed on the via 220, and the pad layer 230 may be electrically connected to the circuit elements 20 through a peripheral contact plug 160p. The pad layer 230 may be, for example, an input/output pad of the semiconductor device 100, and may be disposed in plural on a plane.

Figure 4A:
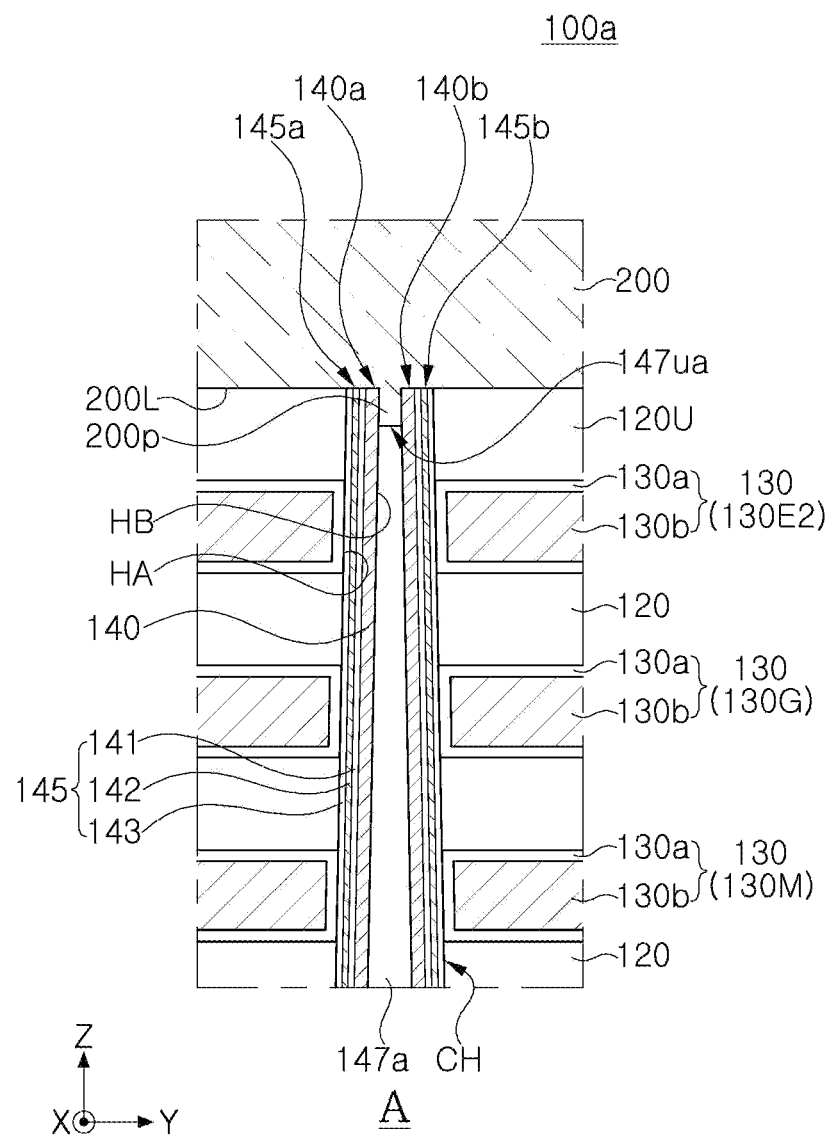
FIGS. 4A and 4B are partially enlarged views of a semiconductor device according to example embodiments.
Figure 4B:
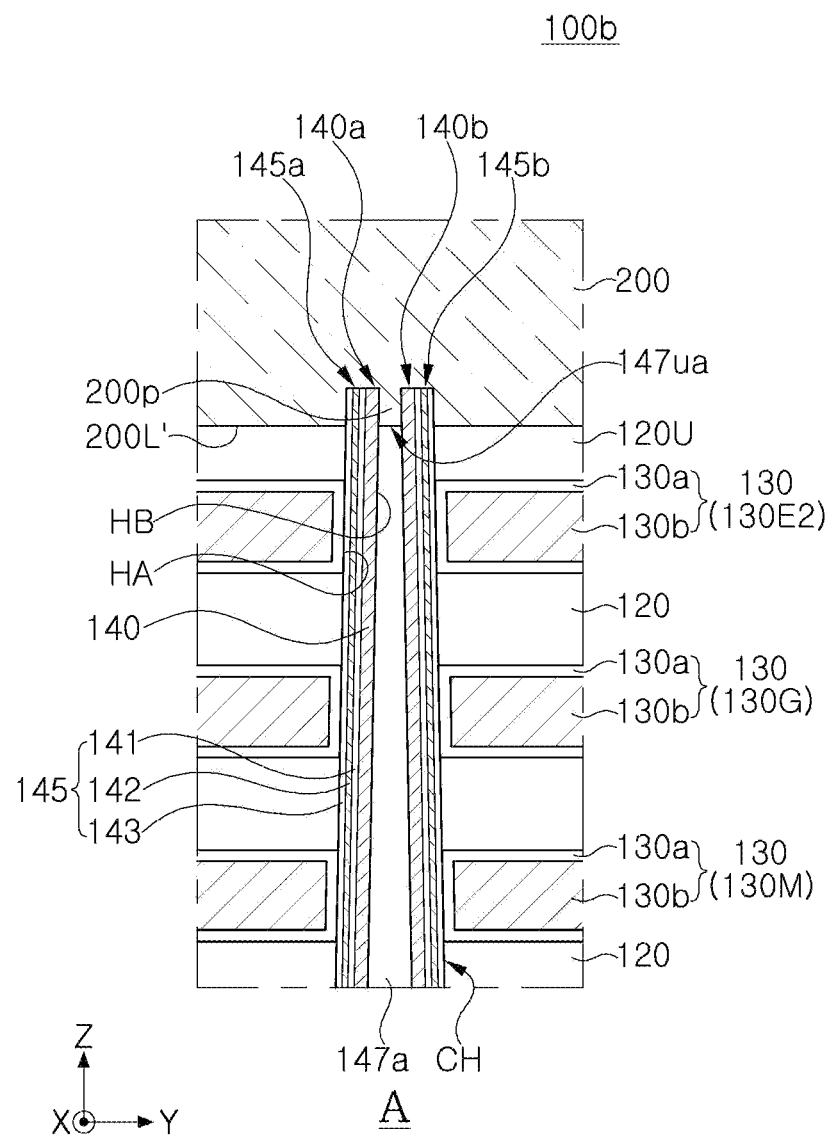

FIGS. 4A and 4B are partially enlarged views of a semiconductor device according to example embodiments. FIGS. 4A and 4B show the region corresponding to FIG. 3A. Referring to FIG. 4A, in the semiconductor device 100a, the plate layer 200 may include a protrusion portion 200p protruding into the inner hole HB of the channel layer 140 and contacting the inner side surface of the channel layer 140. The protrusion portion 200p of the plate layer 200 may be disposed at a level lower than the upper surfaces 140a and 140b of the channel layer 140, and may contact the upper surface 147ua of the core insulating layer 147a located at a level lower than the upper surfaces 140a and 140b of the channel layer 140. The protrusion portion 200p may be located at a level lower than the lower surface 200L of the plate layer 200 in contact with the upper surfaces 140a and 140b of the channel layer 140. The protrusion portion 200p of the plate layer 200 may be formed when a part of the core insulating layer 147 is partially removed from the top. A contact region between the plate layer 200 and the channel layer 140 may increase due to the protrusion portion 200p of the plate layer 200, and thus resistance may decrease.

Referring to FIG. 4B, in the semiconductor device 100b, the plate layer 200 extends between inner side surfaces of the channel layer 140 and includes a protrusion portion 200p in contact with the inner side surface of the channel layer 140, The lower surface 200L' of the plate layer 200 may be located at a level lower than the upper surfaces 140a and 140b of the channel layer 140. The plate layer 200 may be disposed to surround a portion of an outer surface of the gate dielectric layer 145. The upper surfaces 140a and 140b of the channel layer 140 and the upper surfaces 145a and 145b of the gate dielectric layer 145 may be disposed in the plate layer 200.

Figure 5A:
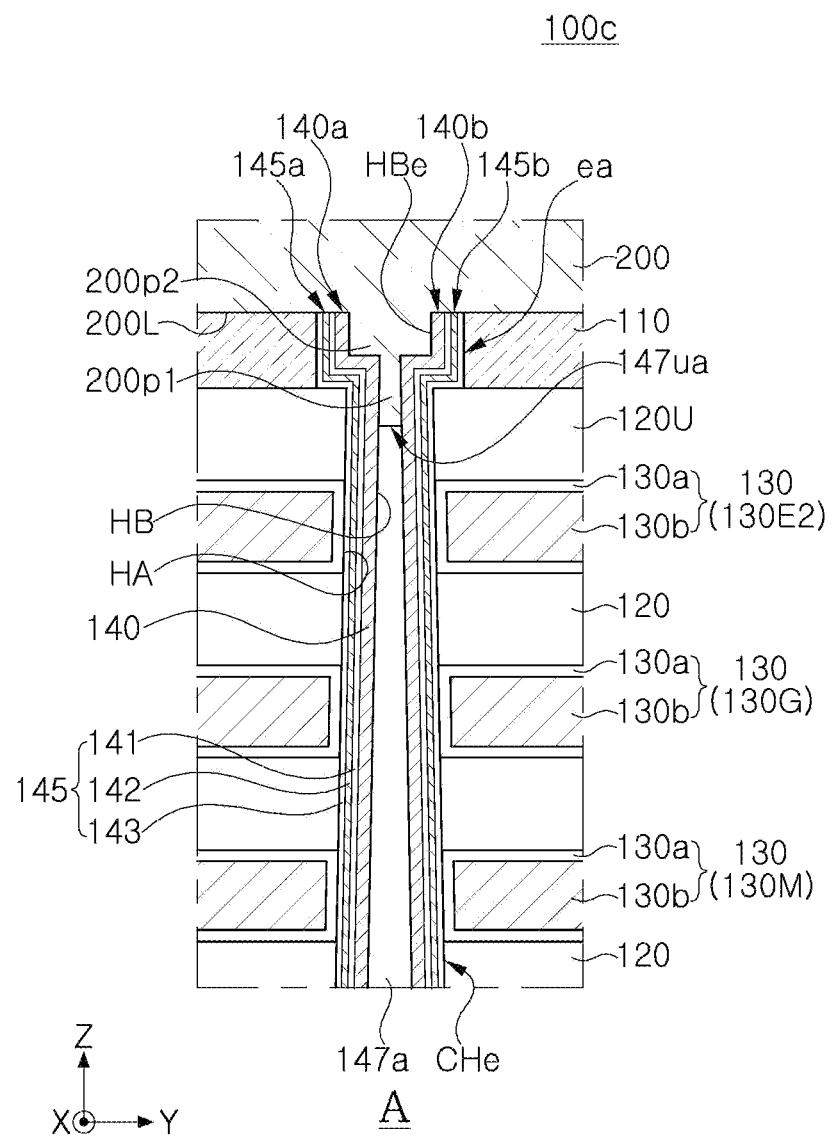
FIGS. 5A and 5B are partially enlarged views of a semiconductor device according to example embodiments.
Figure 5B:
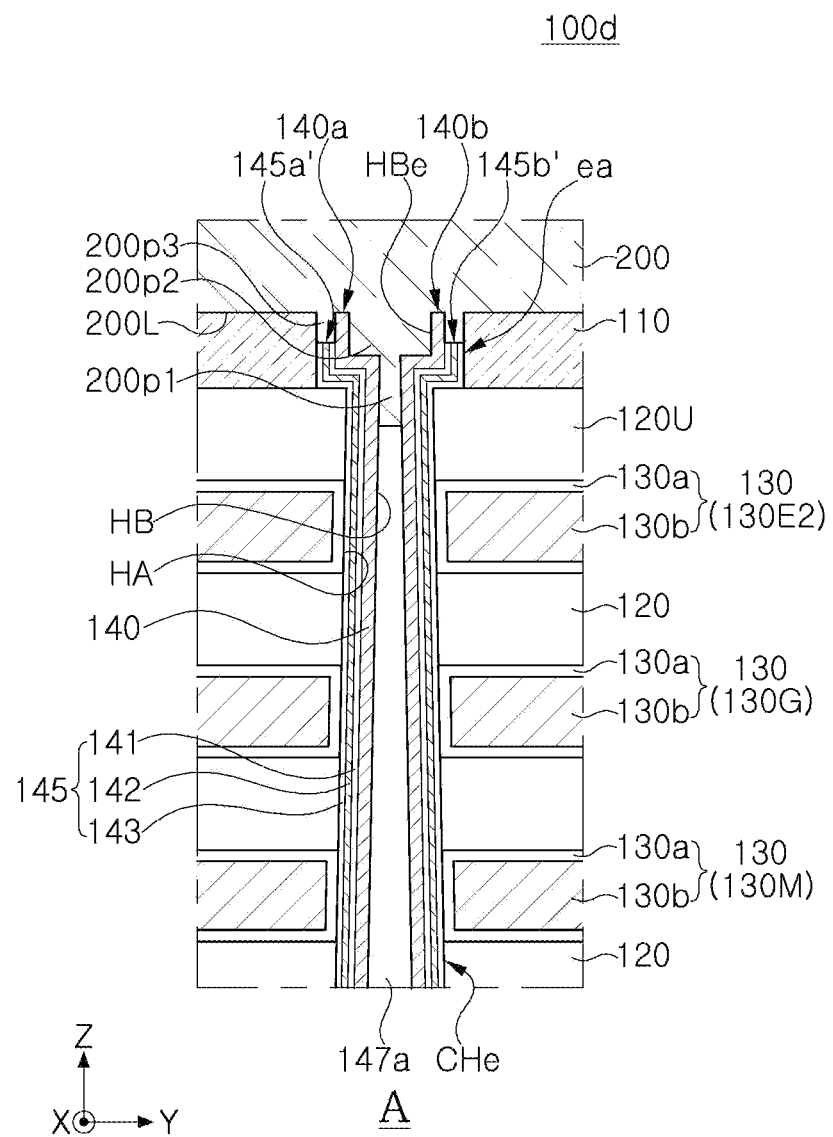

FIGS. 5A and 5B are partially enlarged views of a semiconductor device according to example embodiments. FIGS. 5A and 5B show regions corresponding to FIG. 3a. Referring to FIG. 5A, in the semiconductor device 100c, the second structure 2 further includes a base layer 110 disposed between the stack structure ST and the plate layer 200. The base layer 110 may surround the outer side surface of the gate dielectric layer 145. The channel structure CHe may penetrate the base layer 110. The base layer 110 may include a semiconductor material such as silicon (Si), germanium (Ge), or silicon-germanium (SiGe). The base layer 110 may be formed of polycrystalline silicon undoped with impurities, but impurities included in the plate layer 200 may partially diffuse into the base layer 110. In an example embodiment, the base layer 110 may include at least one of silicon oxide, silicon nitride, and silicon carbide.

The channel structure CHe may have an extended region (ea) extending in the width direction in the base layer 110. For example, the channel layer 140 and the gate dielectric layer 145 of the channel structure CHe may include portions extending into the base layer 110 and bent in a horizontal direction. The inner hole HB of the channel layer 140 may include an expansion hole HBe extended in the width direction in the extension region ea.

The plate layer 200 may include a first protrusion portion 200p1 and a second protrusion portion 200p2 that are in contact with the inner side surface of the channel layer 140 and extend below the lower surface 200L of the plate layer 200. The second protrusion portion 200p2 may be disposed on the first protrusion portion 200p1. The second protrusion portion 200p2 is a portion protruding into the expansion hole HBe from a portion where the plate layer 200 contacts the upper surfaces 140a and 140b of the channel layer 140, and the first protrusion portion 200p1 may be a portion protruding downwardly from the protrusion portion 200p2 and contacting the upper surface 147ua of the core insulating layer 147a. The first protrusion portion 200p1 may extend below the base layer 110. A width of the first protrusion portion 200p1 may be smaller than a width of the second protrusion portion 200p2. As the contact region between the plate layer 200 and the channel layer 140 increases, resistance may decrease.

Referring to FIG. 5B, in the semiconductor device 100d, the second structure 2 further includes a base layer 110, and the plate layer 200 includes a first protrusion portion 200p1 and a second protrusion portion 200p2, a third protrusion portion 200p3. The first protrusion portion 200p1 and the second protrusion portion 200p2 may be the same as described in the embodiment of FIG. 5A, and the third protrusion portion 200p3 may be disposed in a region where a portion of the gate dielectric layer 145 is removed from the top. The upper surfaces 145a' and 145b' of the gate dielectric layer 145 may be positioned at a level lower than the upper surfaces 140a and 140b of the channel layer 140. An outer surface of the channel layer 140 may contact the third protrusion portion 200p3, and an inner side surface of the channel layer 140 may contact the first and second protrusion portions 200p1 and 200p2. At least a portion of the upper region including the upper end of the channel layer 140 may be surrounded by the protrusion portions 200p1, 200p2, and 200p3 of the plate layer 200. As the contact region between the plate layer 200 and the channel layer 140 increases, resistance may decrease.

Figure 6:
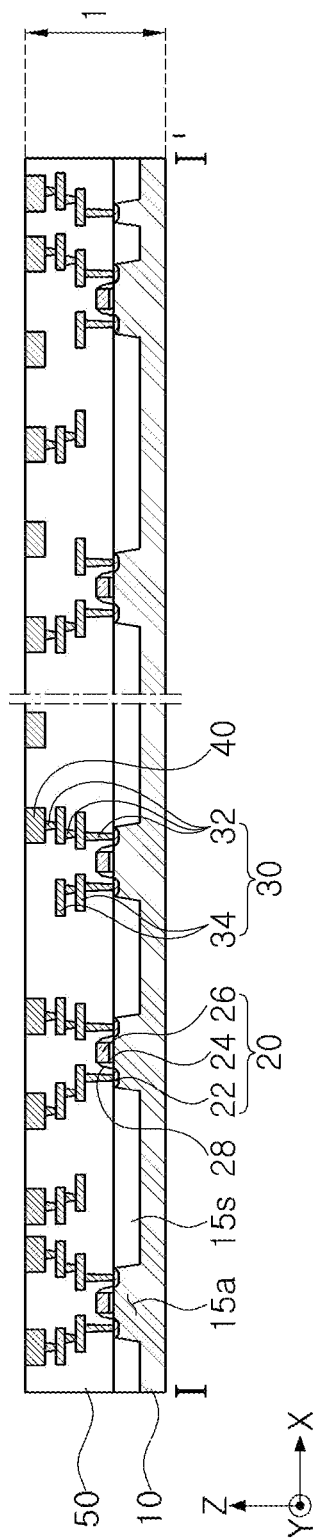
FIGS. 6 to 13C are schematic cross-sectional views illustrating a method of manufacturing a semiconductor device according to example embodiments.

FIGS. 6 to 13C are schematic cross-sectional views for explaining a method of manufacturing a semiconductor device according to example embodiments. FIGS. 6 to 13C show regions corresponding to FIGS. 2A and 2B. Referring to FIG. 6, the circuit elements 20, the lower interconnection structure 30, the lower bonding pads 40, and the lower capping insulating layer 50 constituting the peripheral circuit region may be formed on the substrate 10.

First, device isolation layers 15s may be formed in the substrate 10, and a circuit gate dielectric layer 24, a circuit gate electrode 26, and a spacer layer 28 may be sequentially formed on the substrate 10. The device isolation layers 15s may be formed by, for example, a shallow trench isolation (STI) process. The circuit gate dielectric layer 24 may be formed of silicon oxide, and the circuit gate electrode 26 may be formed of at least one of metal, polycrystalline silicon, or a metal-semiconductor compound layer, but is not limited thereto. A spacer layer 124 may be formed on both sidewalls of the circuit gate dielectric layer 24 and the circuit gate electrode 26. Source/drain regions 22 may be formed in the active region 15a of the substrate 10 at both sides of the circuit gate electrode 26.

The lower contact 32 of the lower interconnection structure 30 may be formed by forming a portion of the lower capping insulating layer 50, then removing the portion by etching and filling the conductive material. The lower interconnection 34 of the lower interconnection structure 30 may be formed by, for example, depositing a conductive material and then patterning the conductive material. The lower interconnection structure 30 may be formed by, for example, a deposition process or a plating process.

The lower bonding pads 40 may be formed by forming a portion of the lower capping insulating layer 50 and then removing a portion by etching and then burying the conductive material, or depositing the conductive material and patterning it. A planarization process may be performed until upper surfaces of the lower bonding pads 40 are exposed.

The lower capping insulating layer 50 may be formed of a plurality of insulating layers. The lower capping insulating layer 50 may be a part in each step of forming the lower interconnection structure 30 and the lower bonding pads 40. Thereby, the first structure 1 may be formed.

Figure 7A:
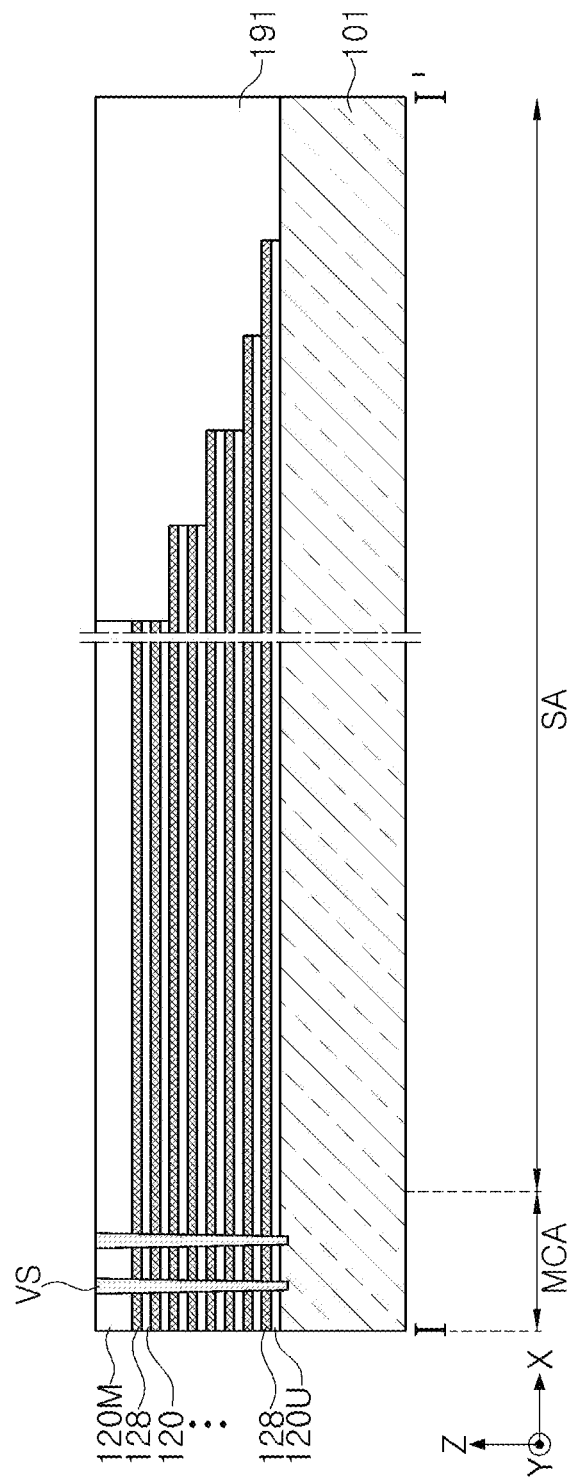
Figure 7B:
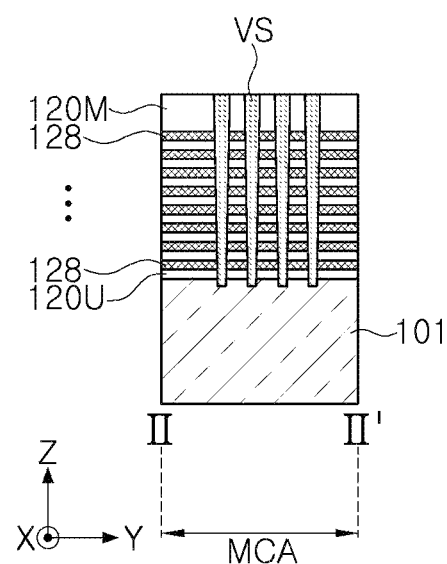

Referring to FIGS. 7A and 7B, a lower mold structure may be formed by alternately stacking interlayer insulating layers 120 and sacrificial insulating layers 128 on a base substrate 101, and the step structure of the lower mold structure, and a lower vertical structure VS may be formed. The base substrate 101 may include a semiconductor material, for example, a group IV semiconductor, a group III-V compound semiconductor, or a group II-VI compound semiconductor. The base substrate 101 may be, for example, a single crystal silicon substrate. The base substrate 101 may be provided as a bulk wafer or an epitaxial layer.

The sacrificial insulating layers 128 may be partially replaced by the gate electrodes 130 (refer to FIG. 2A) through a subsequent process. The sacrificial insulating layers 128 may be formed of a material different from that of the interlayer insulating layers 120, and may be formed of a material that may be etched with etching selectivity for the interlayer insulating layers 120 under specific etching conditions. Each of the sacrificial insulating layers 128 and the interlayer insulating layers 120 may be formed of at least one of silicon, silicon oxide, and silicon nitride. For example, the sacrificial insulating layers 128 may be formed of silicon nitride, and the interlayer insulating layers 120 may be formed of silicon oxide. In embodiments, the thicknesses of the interlayer insulating layers 120 may not all be the same. For example, in the drawing, the interlayer insulating layer 120M stacked on top with respect to the upper surface of the base substrate 101 may have a greater thickness than other interlayer insulating layers 120. The thickness of the interlayer insulating layers 120 and the sacrificial insulating layers 128 and the number of layers constituting the interlayer insulating layers 120 and the sacrificial insulating layers 128 may be variously changed from those illustrated.

A photolithography process for the sacrificial insulating layers 128 using a mask layer so that the upper sacrificial insulating layers 128 extend shorter than the lower sacrificial insulating layers 128 in the second region SA. The etching process may be repeated. Accordingly, the sacrificial insulating layers 128 may form a stepped structure in a step shape in a predetermined unit.

Next, a first capping insulating layer 191 covering the lower mold structure of the sacrificial insulating layers 128 and the interlayer insulating layers 120 is formed, and a lower vertical structure VS penetrating through the lower mold structure may be formed. A portion of the lower vertical structure VS may recess the base substrate 101. The lower vertical structure VS may be formed by forming a lower hole penetrating through the lower mold structure in the Z-direction and filling the lower hole with a sacrificial material. The sacrificial material may include at least one of polycrystalline silicon, silicon oxide, and silicon nitride. The lower vertical structure VS may also be formed at a position corresponding to the dummy vertical structure DS of FIG. 1.

Figure 8A:
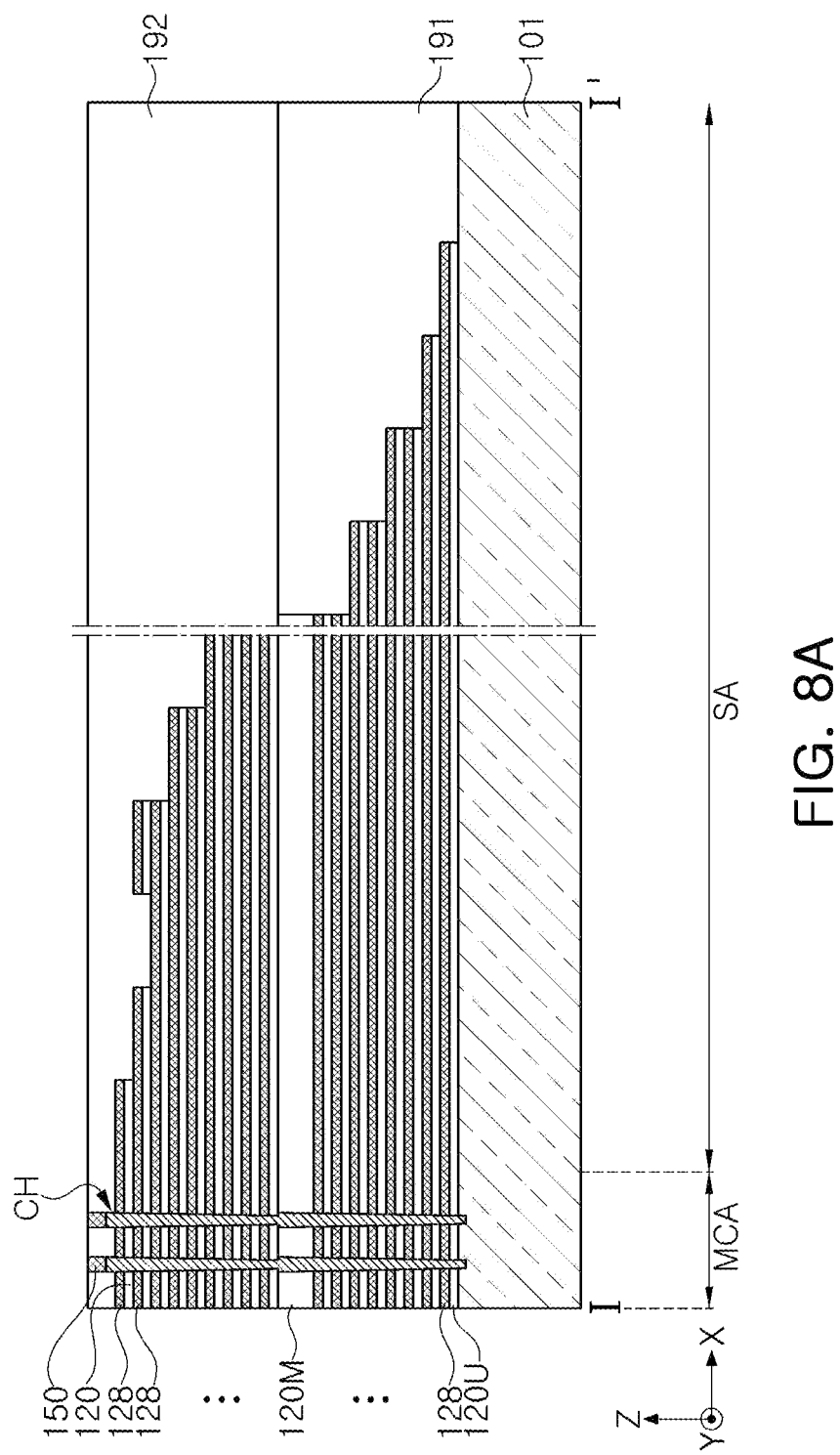
Figure 8B:
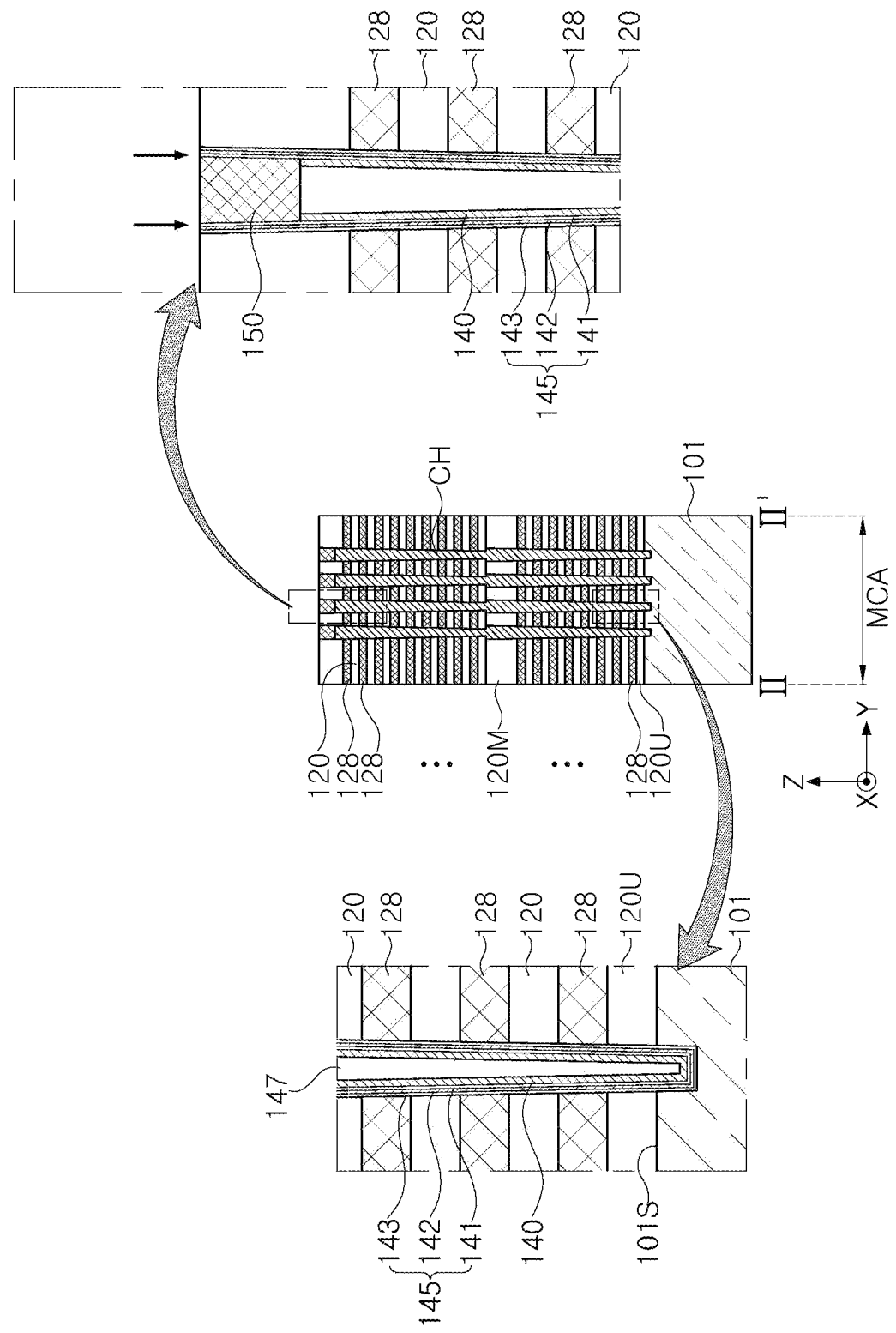

Referring to FIGS. 8A and 8B, an upper mold structure may be formed by alternately stacking sacrificial insulating layers 128 and interlayer insulating layers 120 on the lower mold structure, and a step structure of the upper mold structure is formed. And the channel structures CH may be formed.

First, as described above, the sacrificial insulating layers 128 and the interlayer insulating layers 120 may be alternately and repeatedly laminated on the lower mold structure. As in the lower mold structure, in the upper mold structure, the sacrificial insulating layers 128 in the second region SA may form a stepped structure in a step shape in a predetermined unit. A first capping insulating layer 191 and a second capping insulating layer 192 covering the upper mold structure may be formed.

Next, a channel hole (refer to 'HA' in FIGS. 1 and 3A) is formed by forming an upper hole penetrating through the upper mold structure in the Z-direction and removing the lower vertical structure VS through the upper hole. By forming a plurality of layers in the channel hole, as illustrated in FIG. 1, the channel structure CH may be formed in the first region MCA and the dummy vertical structure DS may be formed in the second region SA. A gate dielectric layer 145, a channel layer 140, a core insulating layer 147, and a channel pad 150 may be formed in the channel hole as illustrated in FIGS. 3A and 3B. The channel structures CH may penetrate the surface 101S of the base substrate 101 and have ends positioned in the base substrate 101. When the dummy vertical structure DS is formed in the same process step as the channel structure CH, the dummy vertical structure DS and the channel structure CH may have the same or similar structure. However, when formed separately from the channel structure CH, a structure in which the inside is filled with an insulating material such as silicon oxide may be included.

While or before forming the channel pad 150 of the channel structure CH, impurities may be implanted into a partial region of the channel layer 140 by an ion implantation process. The impurities may include, for example, at least one of carbon (C), boron (B), phosphorus (P), aluminum (Al), gallium (Ga), arsenic (As), antimony (Sb), and indium (In). The impurities may be implanted into the channel pad 150, and may also be implanted into a partial region of the channel layer 140 adjacent to the channel pad 150. According to embodiments, the type, concentration, and/or implantation depth of the impurity may be variously changed. For example, if the number of erase control gate electrodes increases, the depth of the region into which the impurities are implanted into the channel layer 140 may be relatively deep.

Figure 9A:
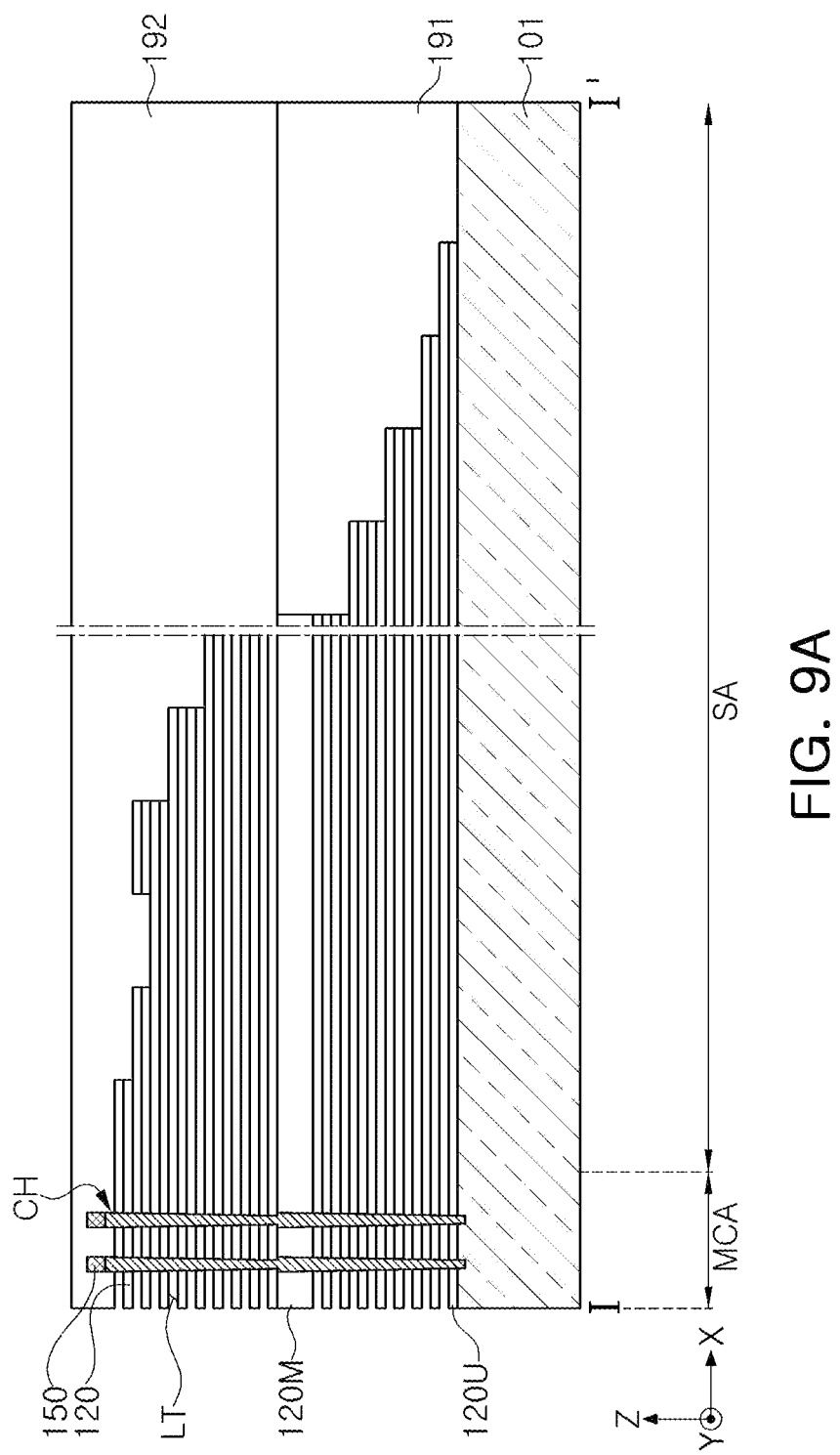
Figure 9B:
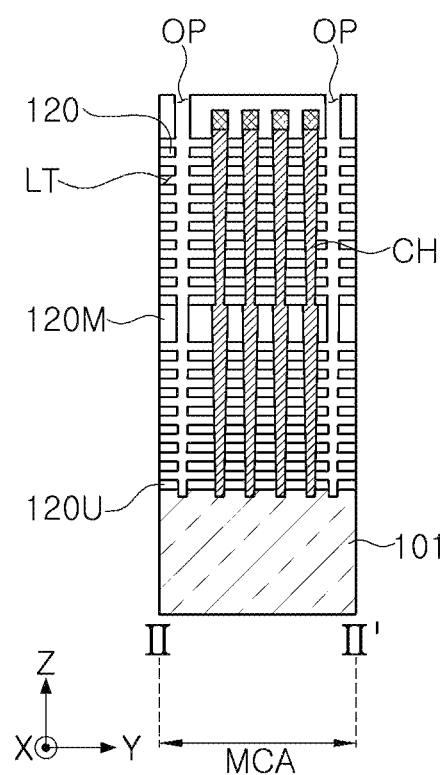

Referring to FIGS. 9A and 9B, separation openings OP penetrating through the stack structure of the interlayer insulating layers 120 and the sacrificial insulating layers 128 are formed, and the sacrificial insulating layers 128 are removed. Horizontal openings LT may be formed.

The separation openings OP may be formed in a trench shape extending in the X-direction. The separation openings OP may pass through the stack structure along the Z-direction and may recess a portion of the base substrate 101. The separation openings OP may expose side surfaces of the sacrificial insulating layers 128. Before forming the separation openings OP, a portion of the second capping insulating layer 192 covering the channel structure CH may be further formed.

The sacrificial insulating layers 128 may be selectively removed with respect to the interlayer insulating layers 120. Accordingly, a plurality of horizontal openings LT may be formed between the interlayer insulating layers 120, and some side surfaces of the gate dielectric layer 145 of the channel structure CH may be exposed through the horizontal openings LT. In this step, the stack structure of the interlayer insulating layers 120 may be stably supported by the channel structures CH and the dummy vertical structure DS of FIG. 1.

Figure 10A:
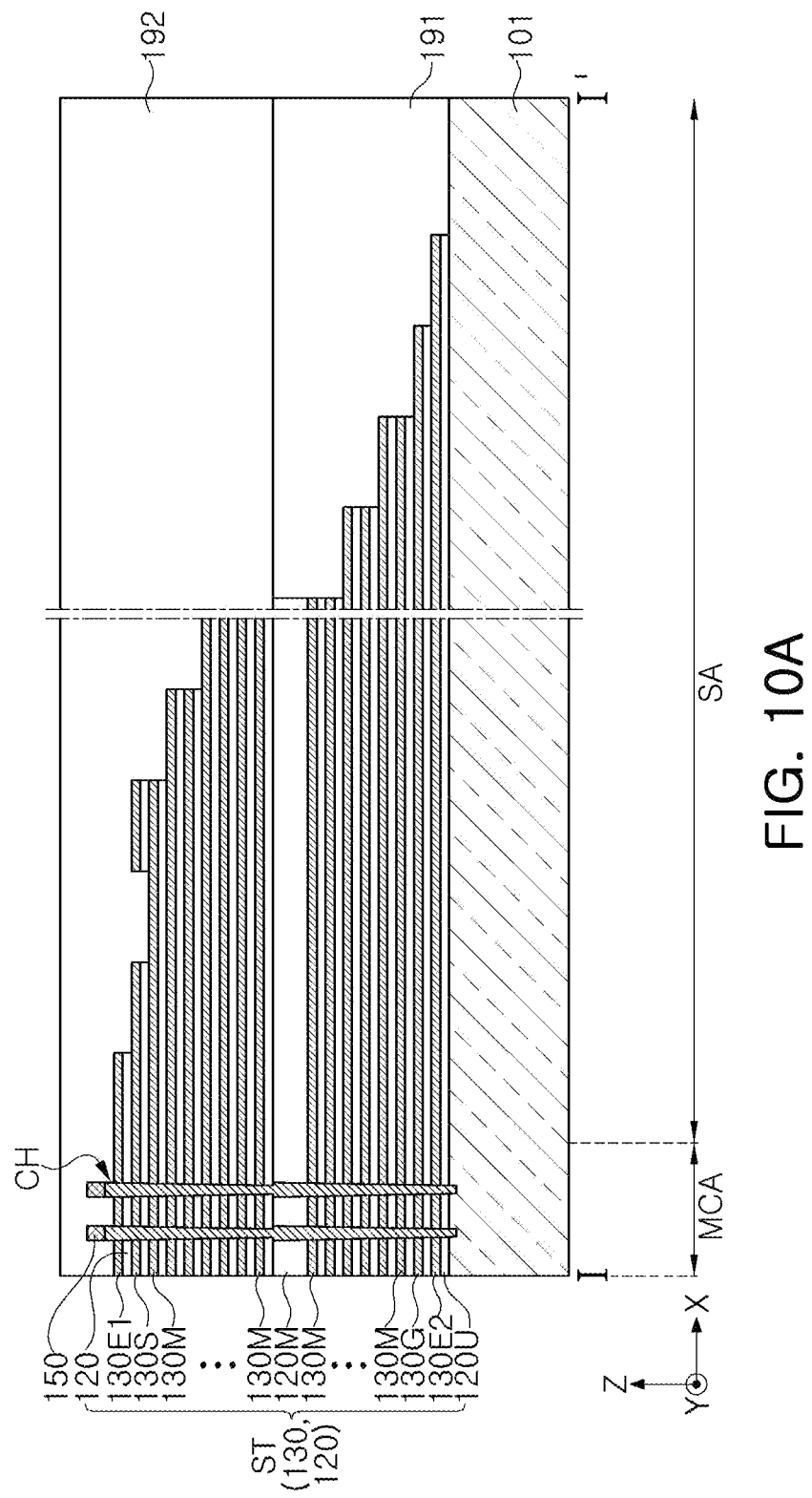
Figure 10B:
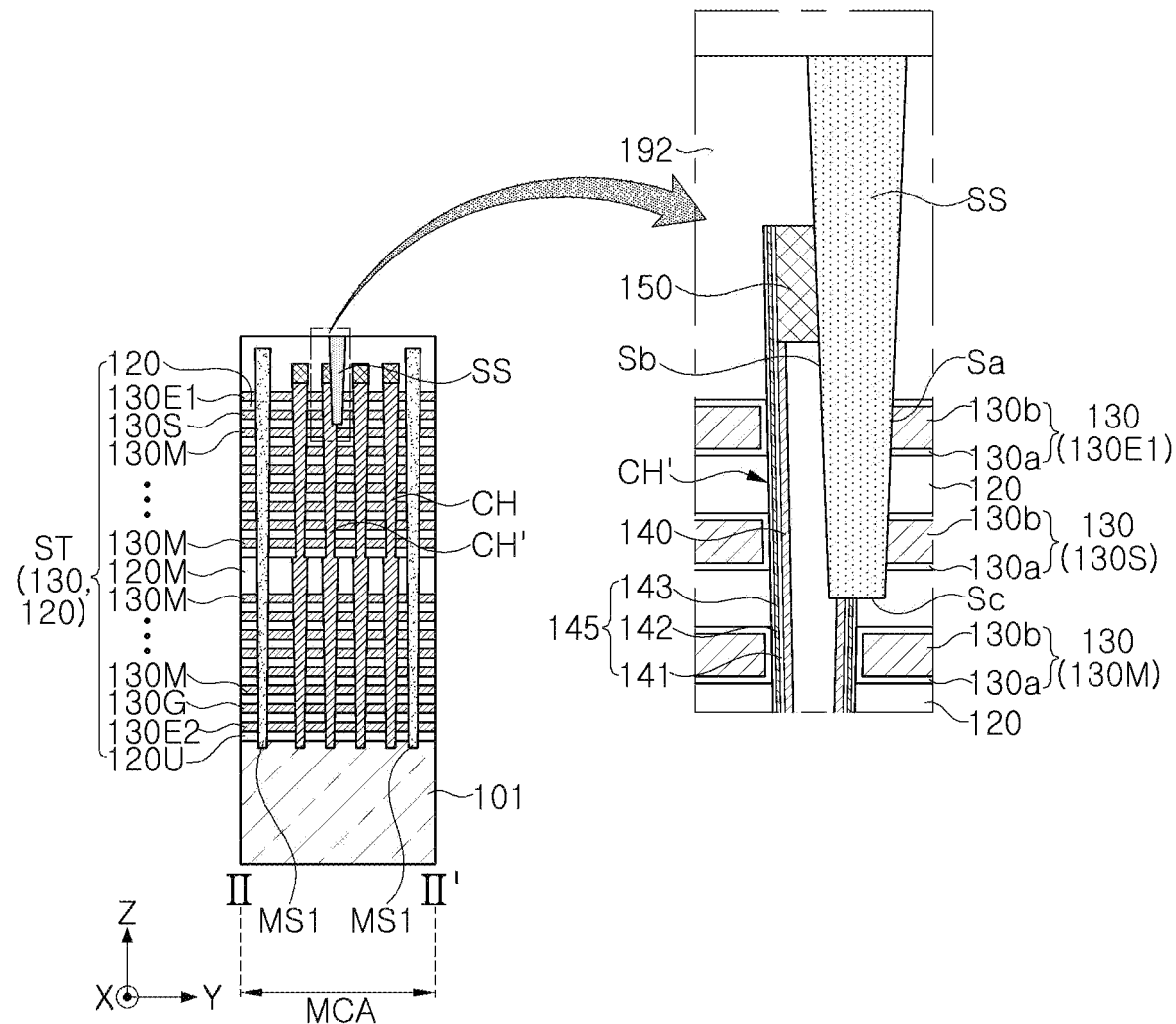

Referring to FIGS. 10A and 10B, the gate electrodes 130 may be formed in the horizontal openings LT through the separation openings OP, and the separation regions MS1 and MS2 may be formed in the separation openings OP. And the string separation region SS may be formed.

The gate electrodes 130 may be formed by filling the horizontal openings LT formed by removing the sacrificial insulating layers 128 through the separation openings OP with a conductive material. The gate electrodes 130 may be formed by sequentially depositing the first layer 130*a* and the second layer 130*b* in the horizontal openings LT as illustrated in FIG. 3A.

After the gate electrodes 130 are formed, the conductive material deposited in the separation openings OP is removed through an additional process, and then the separation regions MS1 (see FIG. 1 for MS2) may be formed by filling an insulating material.

Next, after a portion of the second capping insulating layer 192 may be further formed to cover the separation regions MS1 and MS2, the string separation region SS may be formed. The string separation region SS may divide at least one upper gate electrode 130 including the uppermost gate electrode 130E1, among the gate electrodes 130, in the Y-direction, based on the surface 101S of the base substrate 101. For example, the string separation region SS may be formed to pass through the first erase control gate electrode 130E1 and the string selection gate electrode 130S. The string separation region SS may be formed to overlap at least one channel structure CH' among the channel structures CH in the Z-direction. Accordingly, the string separation region SS may cut a portion of the at least one channel structure CH'.

Figure 11A:
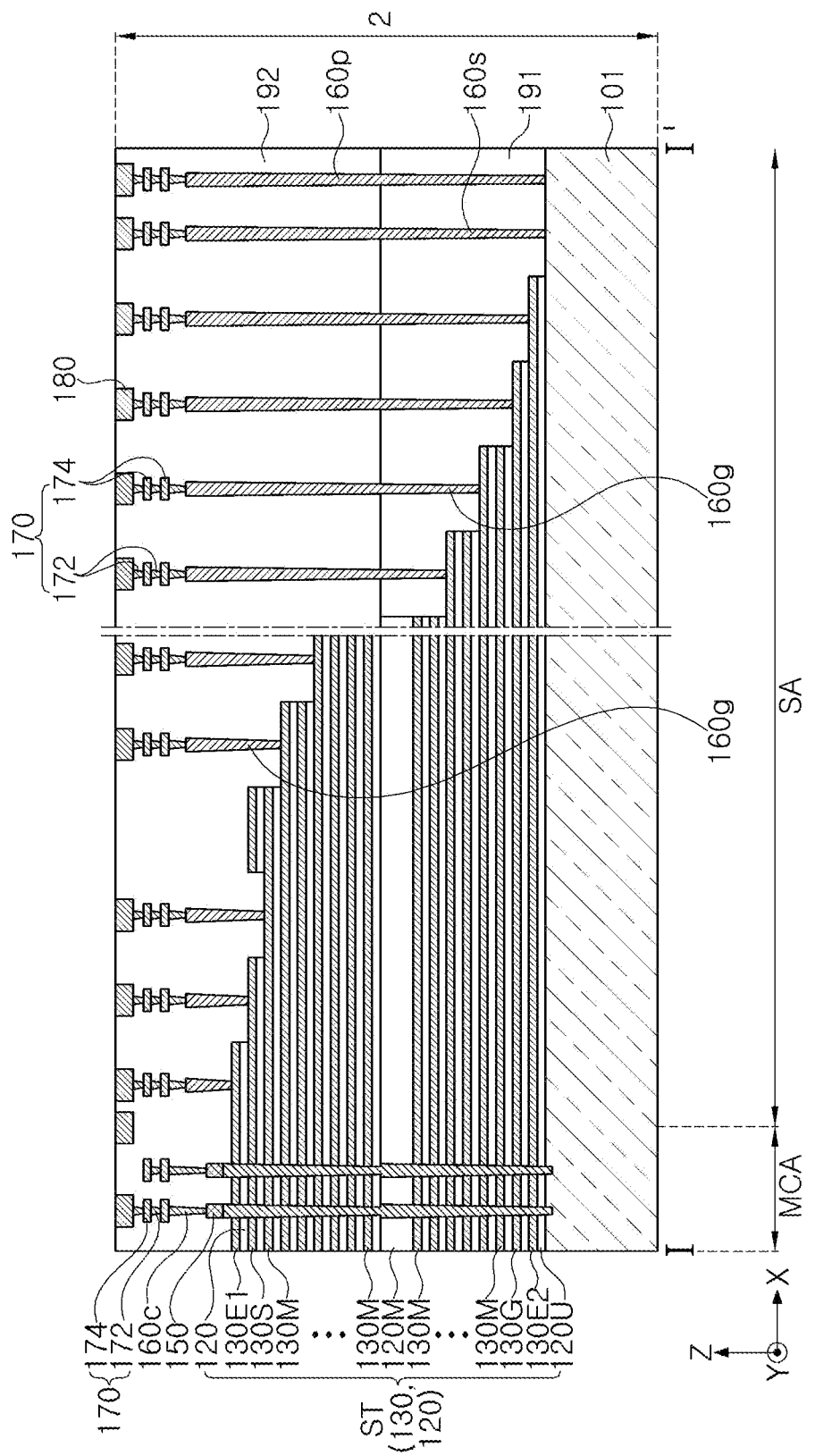
Figure 11B:
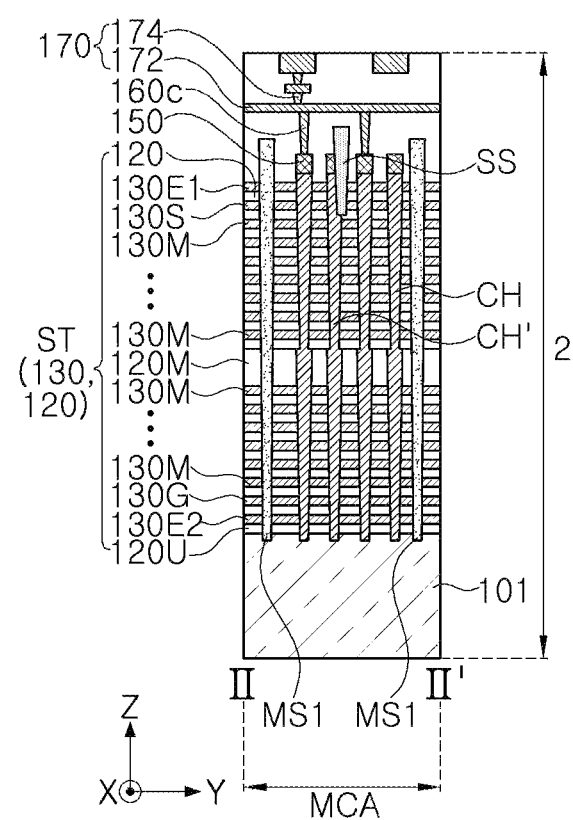

Referring to FIGS. 11A and 11B, contact plugs 160*g*, 160*c*, 160*s*, and 160*p* may be formed, and an upper interconnection structure 170 and upper bonding pads 180 may be formed. The gate contact plugs 160*a* may be formed to be connected to the gate electrodes 130, and the channel contact plugs 160*c* may be formed to be connected to the channel pad 150 of the channel structures CH. The source contact plug 160*s* and the peripheral contact plug 160*p* may be formed to be connected to the base substrate 101. The contact plugs 160*g*, 160*c*, 160*s*, and 160*p* are formed to have different depths, but may be formed by simultaneously forming contact holes using an etch stop layer or the like and then filling the contact holes with a conductive material.

However, in example embodiments, some of the contact plugs 160*g*, 160*c*, 160*s*, and 160*p* may be formed in different process steps.

The upper interconnection structure 170 and the upper bonding pads 180 may be formed by forming a portion of the second capping insulating layer 192 and then etching and removing a portion thereof, and by filling with a conductive material or depositing a conductive material and then patterning the same. A planarization process may be performed until the upper surfaces of the upper bonding pads 180 are exposed. Each of the capping insulating layers 191 and 192 may be formed of a plurality of insulating layers. Thereby, the second structure 2 may be formed. However, in the manufacturing process of the semiconductor device, the second structure 2 may be in a state in which the base substrate 101 is disposed on the stack structure ST, unlike FIG. 2A.

Figure 12A:
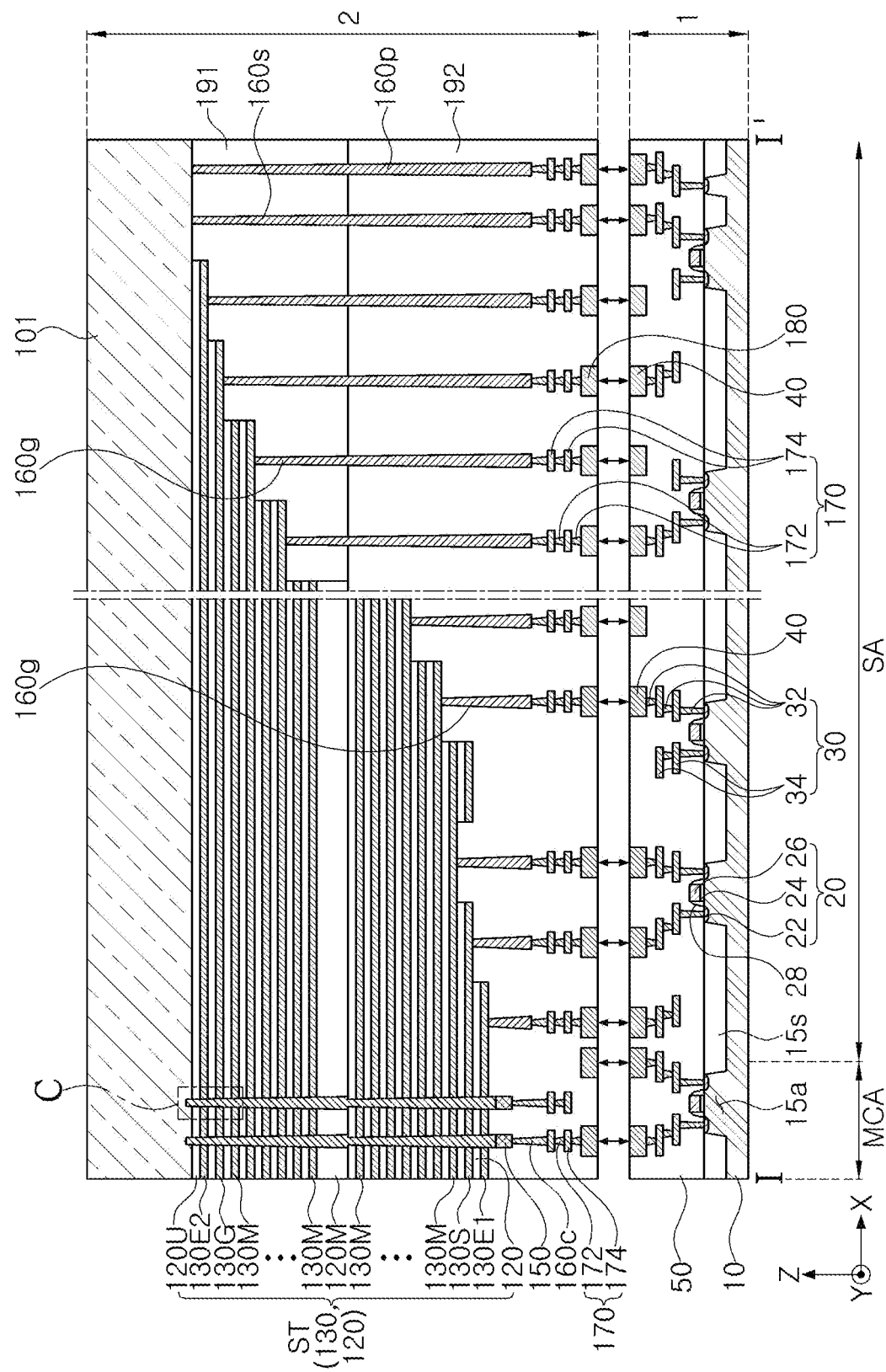
Figure 12B:
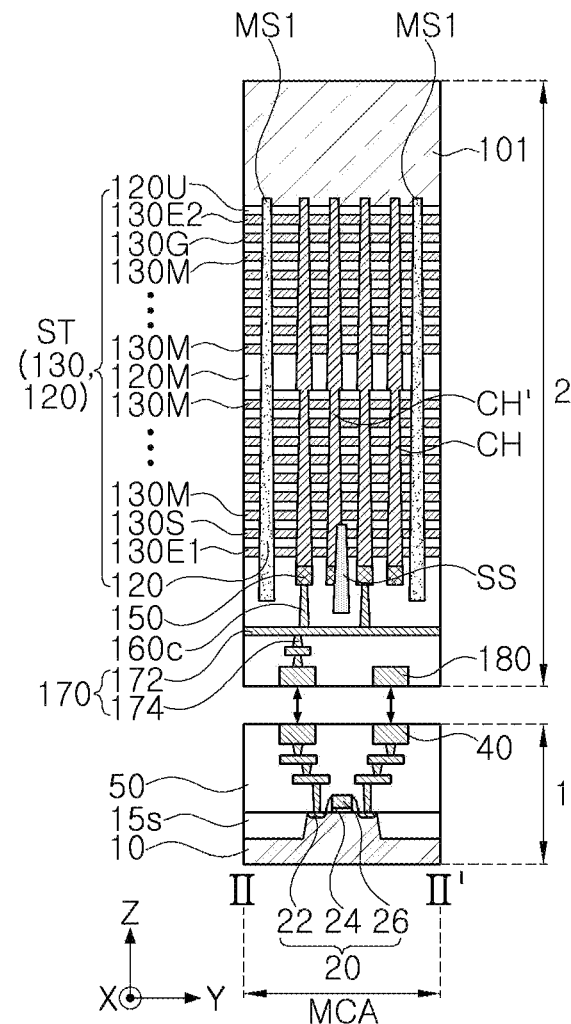

Referring to FIGS. 12A and 12B, the first structure 1 and the second structure 2 may be bonded.

The first structure 1 and the second structure 2 may be connected by bonding the lower bonding pads 40 and the upper bonding pads 180 by pressing. The second structure 2 may be turned over on the first structure 1 to be bonded so that the upper bonding pads 180 face down. The first structure 1 and the second structure 2 may be directly bonded without the intervening of an adhesive such as an adhesive layer.

Figure 13A:
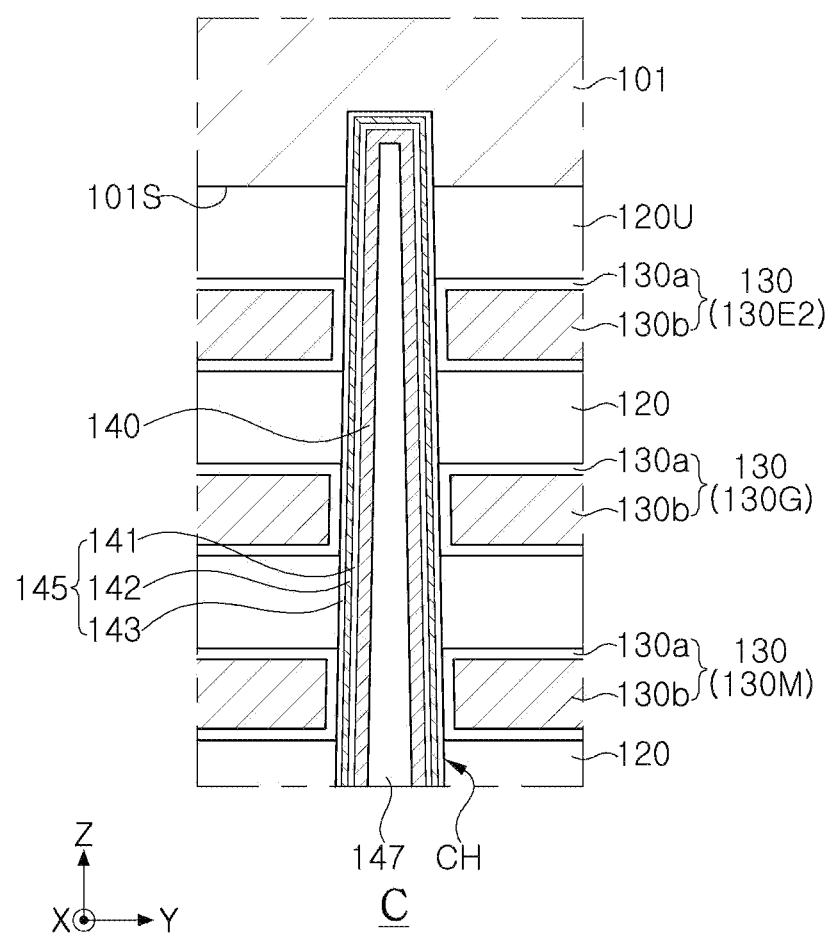

FIG. 13A is an enlarged view of region 'C' of FIG. 12A after the first structure 1 and the second structure 2 are bonded. The upper end of the channel structure CH may penetrate the surface 101S of the base substrate 101. In the channel structure CH, the gate dielectric layer 145 and the channel layer 140 may be conformally formed from the inner wall of the channel hole.

Figure 13B:
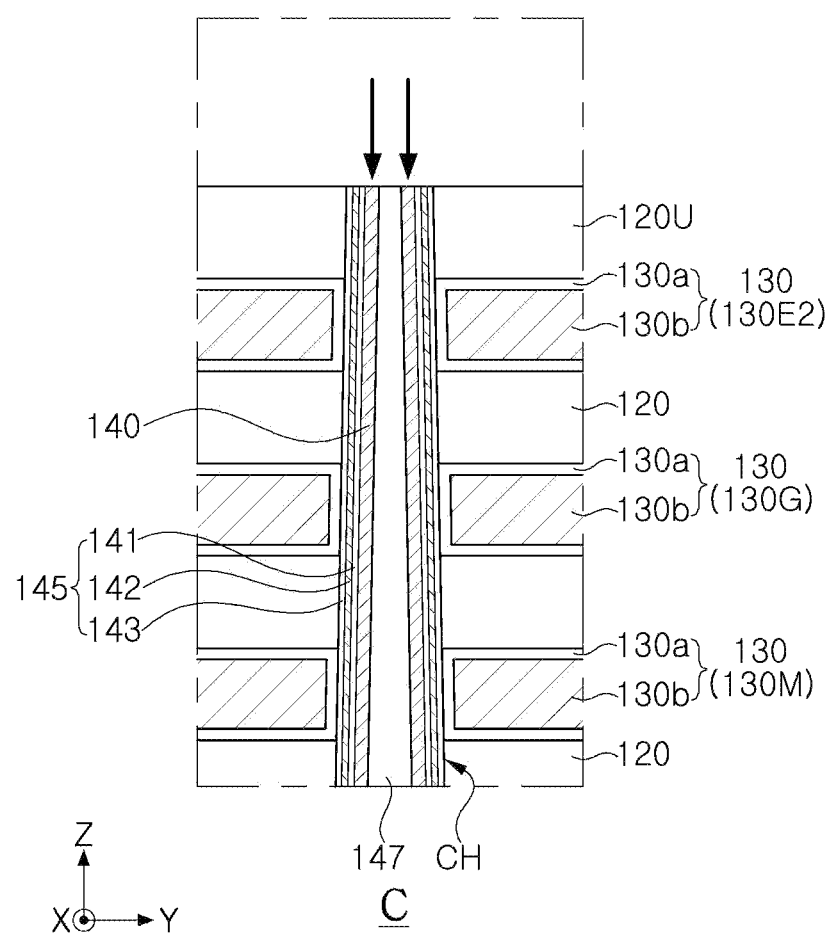

Referring to FIG. 13B, the base substrate 101 may be removed by performing a planarization process on the second structure 2. The base substrate 101 is removed by performing a planarization process, and ends of the uppermost interlayer insulating layer 120U, the channel layer 140 of the channel structure CH, the gate dielectric layer 145 and the core insulating layer 147 may be exposed. Through the planarization process, the upper surface of the channel layer 140, the upper surface of the gate dielectric layer 145, and the upper surface of the core insulating layer 147 may be substantially coplanar. In this step, ends of the separation regions MS1 and MS2 and the contact plugs 160*s* and 160*p* that were in contact with the base substrate 101 may also be exposed.

Impurities may be implanted into the exposed channel layer 140 through an ion implantation process. The impurities may include, for example, at least one of carbon (C), boron (B), phosphorus (P), aluminum (Al), gallium (Ga), arsenic (As), antimony (Sb), and indium (In). Impurities may be implanted into a partial region of the channel layer 140. According to embodiments, the type, concentration, and/or implantation depth of the impurity may be variously changed. Since the base substrate 101 is removed after bonding the first structure 1 and the second structure 2, the ion implantation process may be performed on the upper end of the channel layer 140 adjacent to the base substrate 101. Therefore, in the erase control transistor including the uppermost second erase control gate electrode 130E2, the junction overlap may be stably formed to a target depth, and a sufficient amount of GIDL current may be generated during the erase operation. Accordingly, the erase operation efficiency of the memory cells may be improved.

Figure 13C:
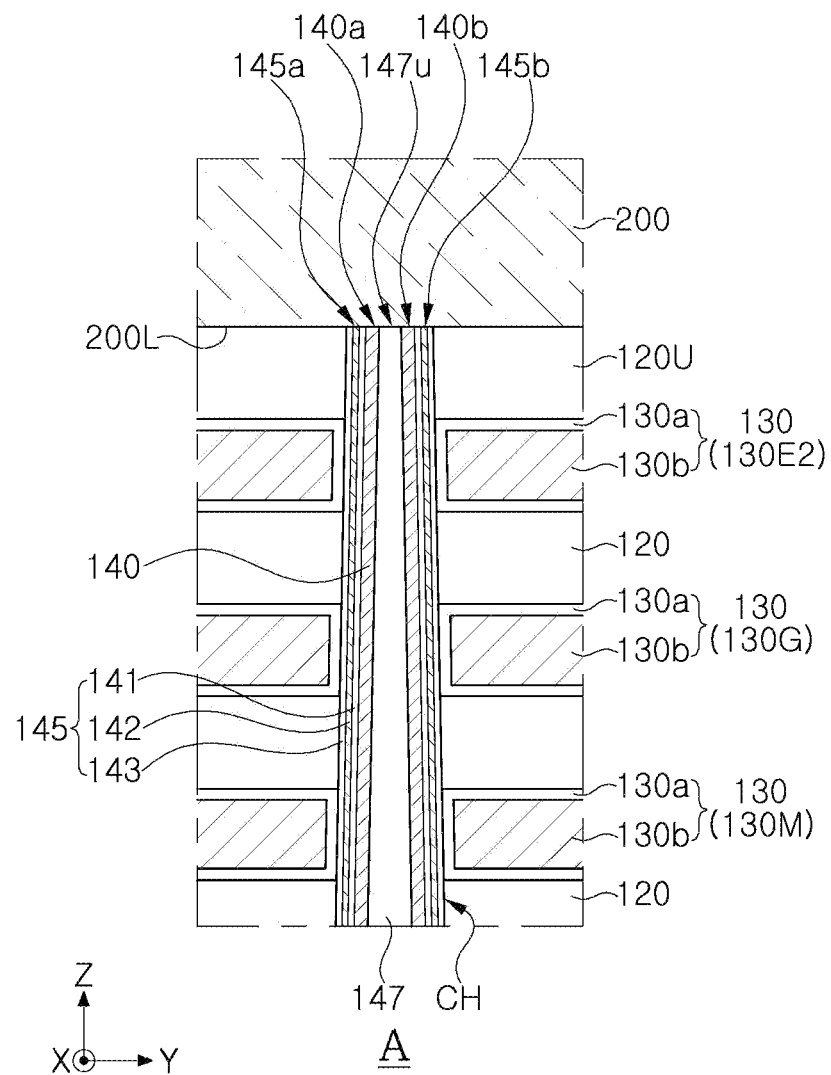

Referring to FIG. 13C, the plate layer 200 may be formed to cover upper ends of the stack structure ST and the channel structure CH. The plate layer 200 may be formed to contact the upper surfaces 140a and 140b of the channel layer 140 and the upper surfaces 145a and 145b of the gate dielectric layer 145. The lower surface 200L of the plate layer 200 may be formed on the same level as the upper surfaces 140a and 140b of the channel layer 140 and the upper surfaces 145a and 145b of the gate dielectric layer 145. The plate layer 200 may be patterned in a partial region, and an upper insulating layer 210 may be formed on the region removed by patterning and on the plate layer 200, and a pad layer 230 and a via 220 penetrating through the upper insulating layer 210 to be connected to the peripheral contact plug 160p may be further formed. After the plate layer 200 is formed, an upper conductive layer 205 may be further formed. Accordingly, the semiconductor device 100 of FIGS. 1 to 3B may be manufactured.

Figure 14A:
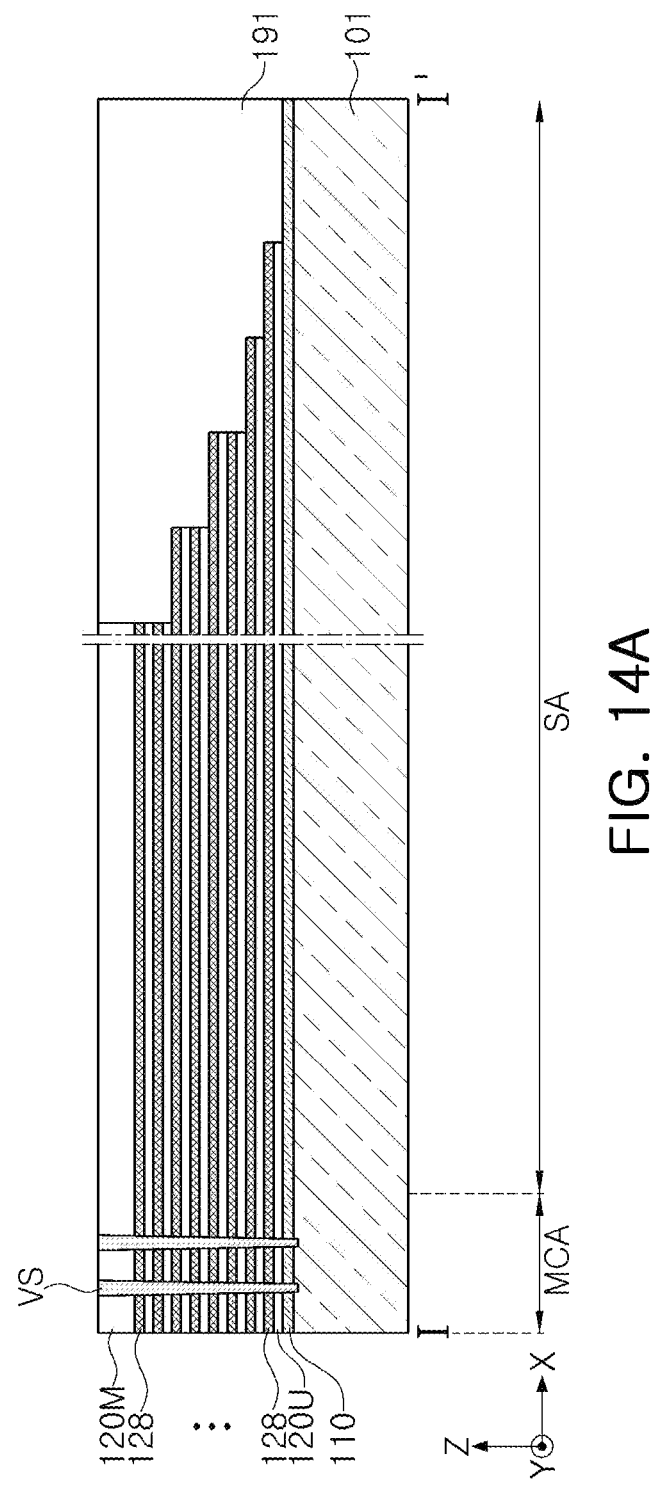
FIGS. 14A to 16C are schematic cross-sectional views illustrating a method of manufacturing a semiconductor device according to example embodiments.
Figure 14B:
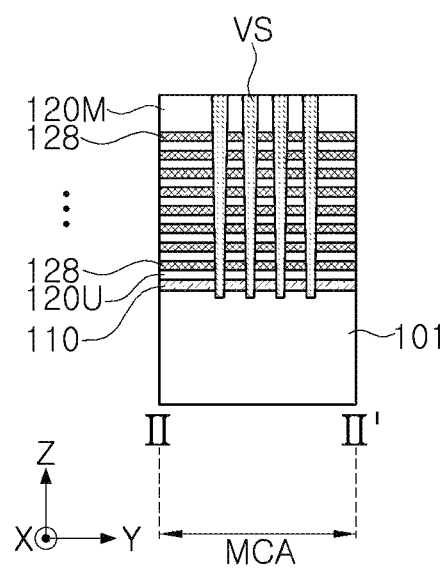

FIGS. 14A to 16C are schematic cross-sectional views for explaining a method of manufacturing a semiconductor device according to example embodiments. Referring to FIGS. 14A and 14B, in the same process as the manufacturing process of the semiconductor device of FIGS. 7A and 7B, but before stacking the sacrificial insulating layers 128 and the interlayer insulating layers 120 alternately, the base layer 110 may be first formed on the base substrate 101. The lower vertical structure VS may be formed to penetrate the lower mold structure and also penetrate the base layer 110.

Figure 15A:
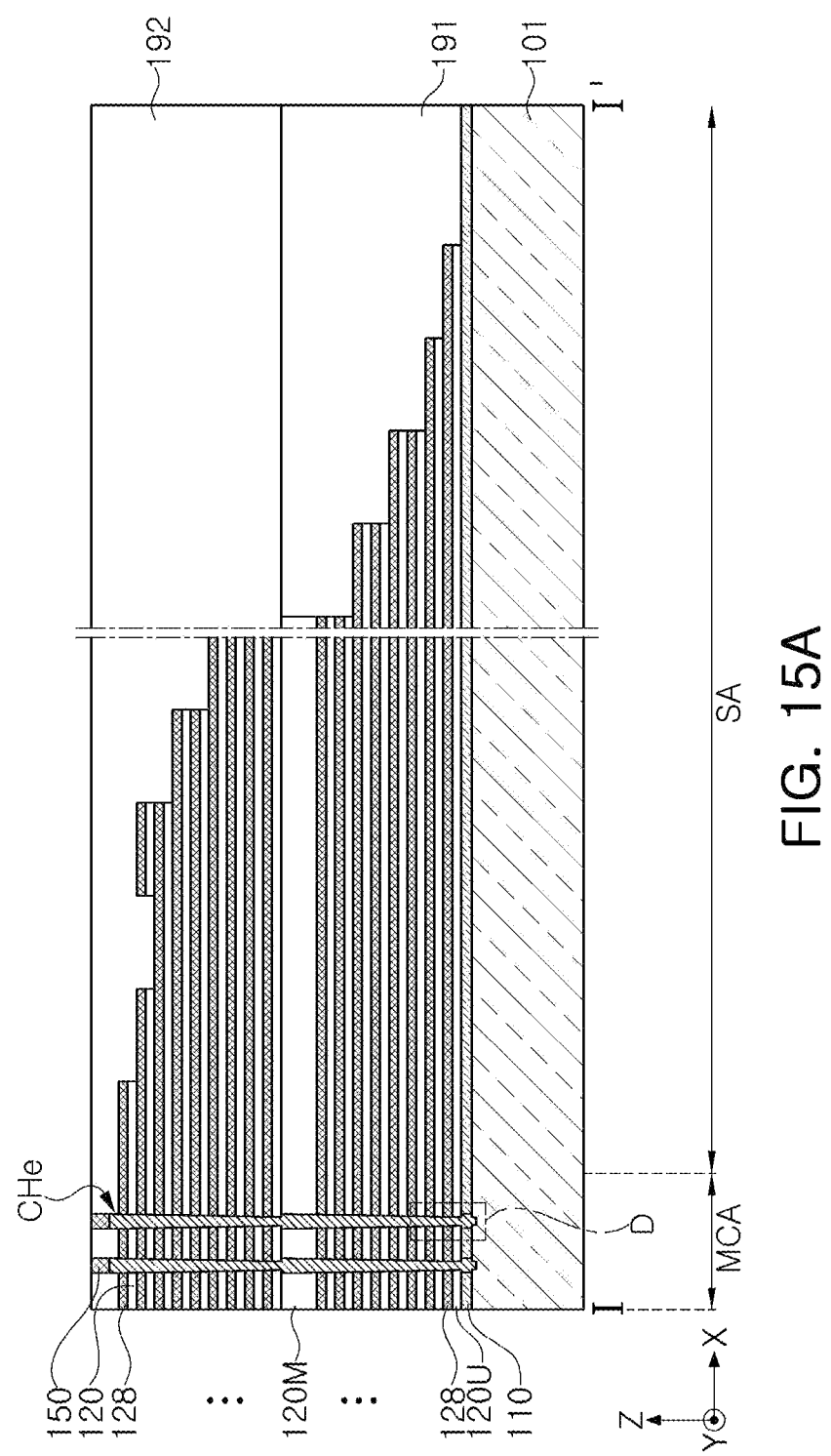
Figure 15B:
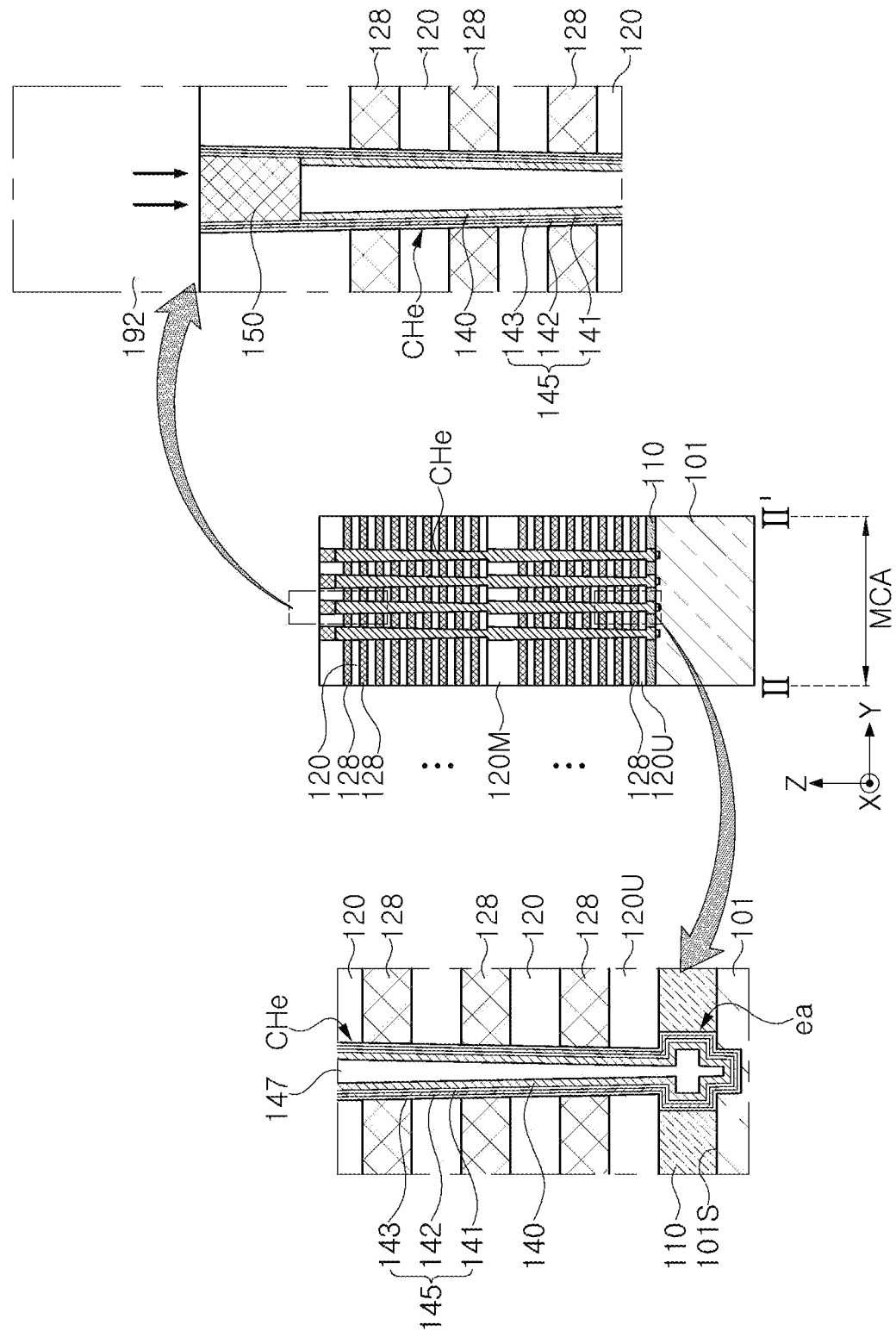

Referring to FIGS. 15A and 15B, a process for manufacturing the semiconductor device of FIGS. 8A and 8B is the same as that of the semiconductor device of FIGS. 8A and 8B, but a process for allowing the channel structure CHe to have an extension region (ea) in the base layer 110 may further be performed. After removing the lower vertical structure VS, a portion of the base layer 110 exposed through the channel hole is selectively removed with respect to the base substrate 101, the interlayer insulating layers 120, and the sacrificial insulating layers 128. Accordingly, the channel hole may have an extended region (ea) extending in the width direction in the base layer 110. Next, a gate dielectric layer 145, a channel layer 140, and a core insulating layer 147 may be sequentially deposited in the channel hole. In the extension region (ea), the channel layer 140 and the gate dielectric layer 145 may have bent portions. The core insulating layer 147 may be formed to have a void in the extended region (ea). Thereafter, the manufacturing steps of the semiconductor device described with reference to FIGS. 9A to 12B may be performed.

Figure 16A:
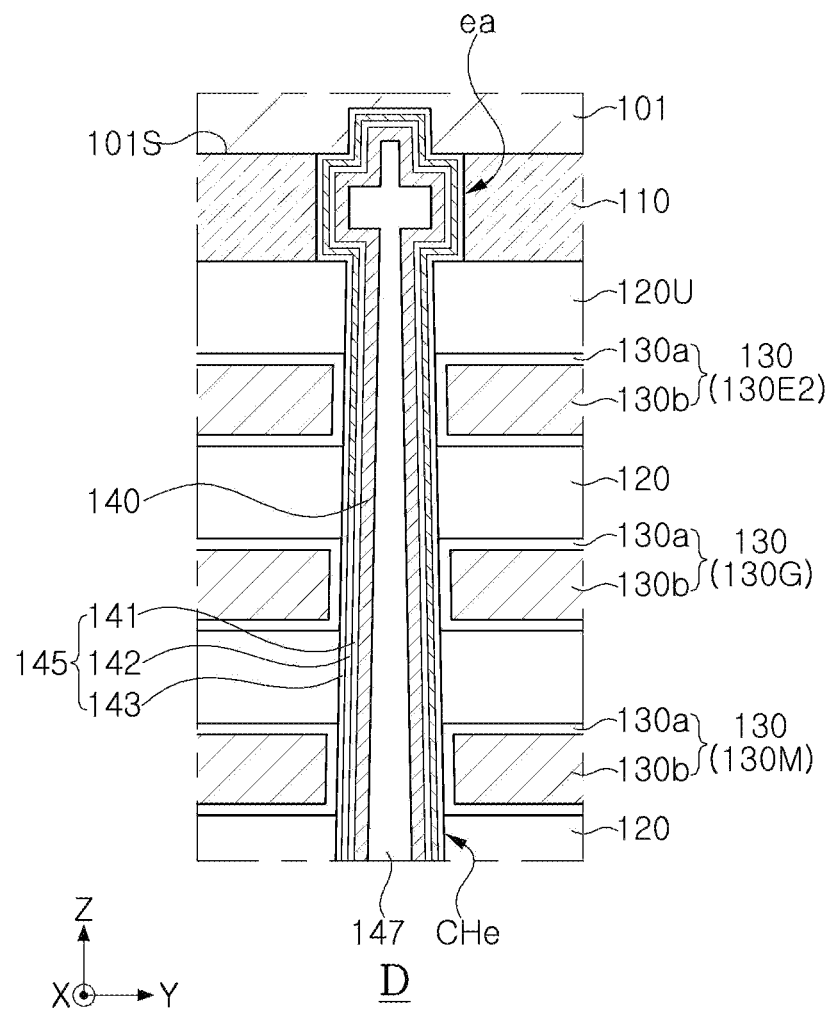

FIG. 16A is an enlarged view of a region corresponding to region 'D' of FIG. 15A after performing the above-described manufacturing steps of the semiconductor device. The upper end of the channel structure CHe having the extended region (ea) may penetrate the base layer 110. The upper end of the channel structure CHe may penetrate the surface 101S of the base substrate 101.

Figure 16B:
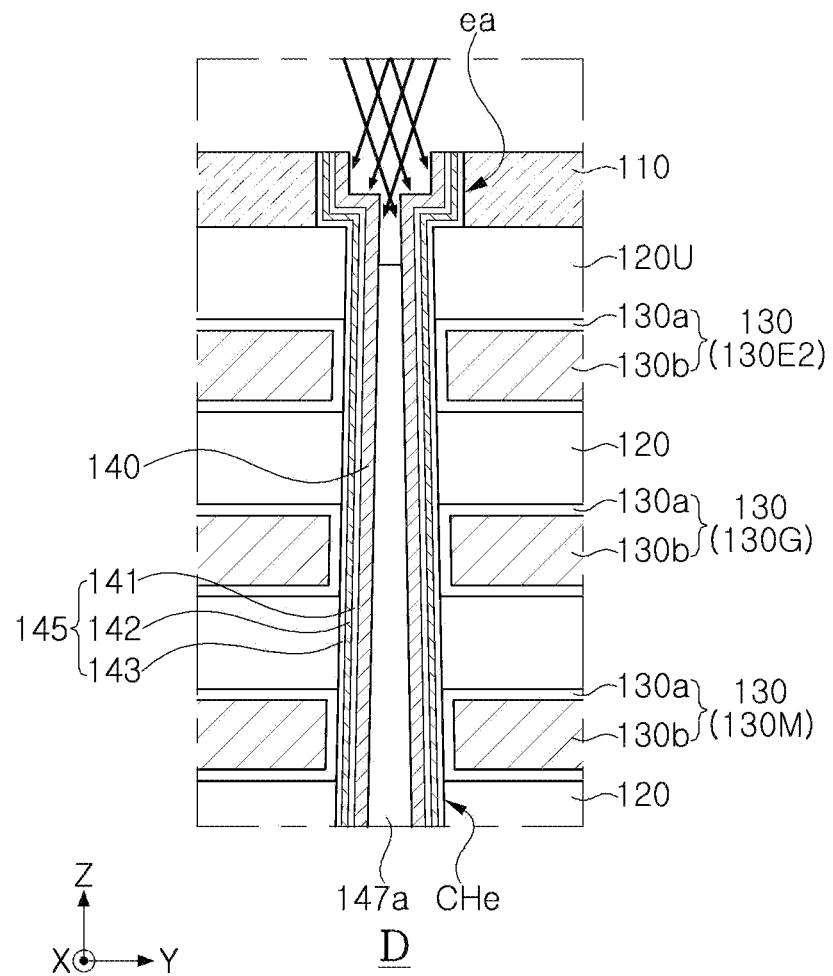

Referring to FIG. 16B, a part of the base substrate 101 and the base layer 110 may be removed by performing a planarization process on the second structure 2. A part of the base substrate 101 and the base layer 110 are removed by performing a planarization process, and ends of the channel layer 140, the gate dielectric layer 145, and the core insulating layer 147 of the channel structure CHe may be exposed. A part of the core insulating layer 147 may be selectively removed with respect to the gate dielectric layer 145, the channel layer 140, and the base layer 110. After performing the planarization process, an etching process may be further performed so that the upper surface of the core insulating layer 147 is positioned lower than the upper surface of the channel layer 140.

Impurities may be implanted into the exposed channel layer 140 through an ion implantation process. The ion implantation process may be a tilted ion implantation process, and impurities may be effectively implanted toward the inner side surface of the channel layer 140 exposed in the extension region ea. The impurities may include, for example, at least one of carbon (C), boron (B), phosphorus (P), aluminum (Al), gallium (Ga), arsenic (As), antimony (Sb), and indium (In). Impurities may be implanted into a partial region of the channel layer 140. According to embodiments, the type, concentration, and/or implantation depth of the impurity may be variously changed. Since the base substrate 101 is removed after bonding the first structure 1 and the second structure 2, an ion implantation process may be performed on the upper end of the channel layer 140 that was in contact with the base substrate 101. Therefore, in the erase control transistor including the uppermost second erase control gate electrode 130E2, the junction overlap may be stably formed to a target depth, and a sufficient amount of GI DL current may be generated during the erase operation. Accordingly, the erase operation efficiency of the memory cells may be improved.

Figure 16C:
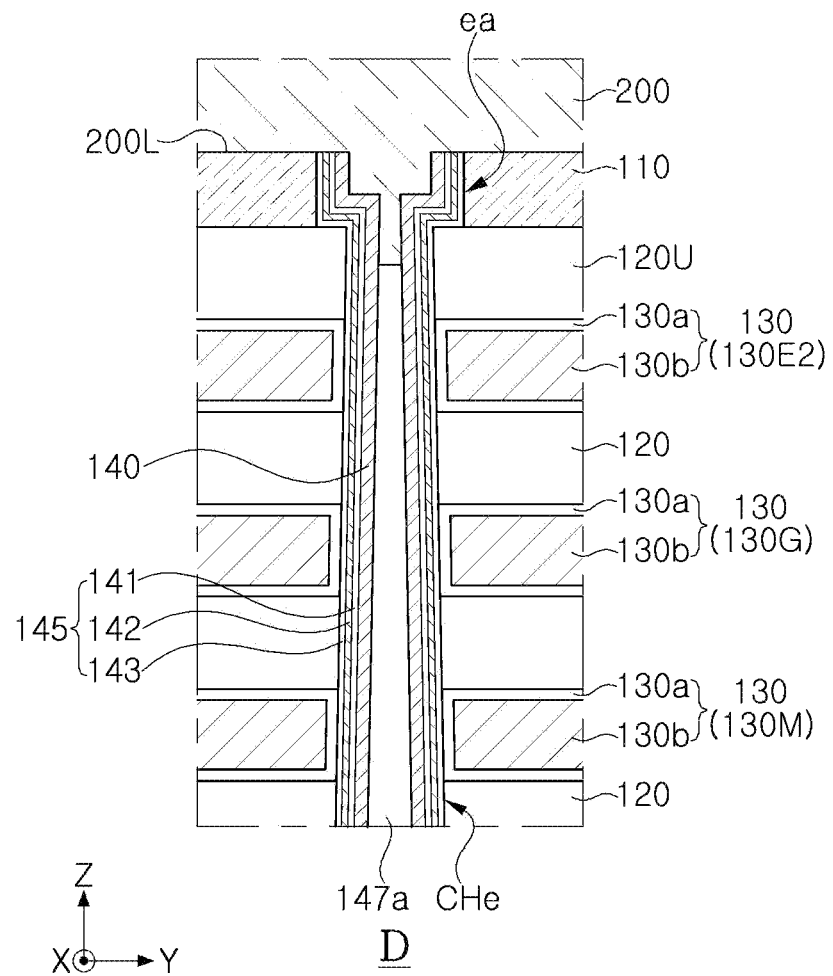

Referring to FIG. 16C, the plate layer 200 may be formed on the base layer 110. The plate layer 200 may be formed to cover the upper surface of the base layer 110. The plate layer 200 may be formed to fill an region in which the core insulating layer 147 is partially removed and to be in contact with the inner side surface of the channel layer 140. Accordingly, as illustrated in FIG. 5A, the plate layer 200 may be formed to have protrusion portions 200p1 and 200p2. Thereafter, the semiconductor device 100c of FIG. 5A may be manufactured by partially patterning the plate layer 200 and further forming the upper insulating layer 210, the via 220, and the pad layer 230. When a portion of the gate dielectric layer 145 is removed from the top and the plate layer 200 is formed, the semiconductor device 100d of FIG. 5B may be manufactured.

Figure 17:
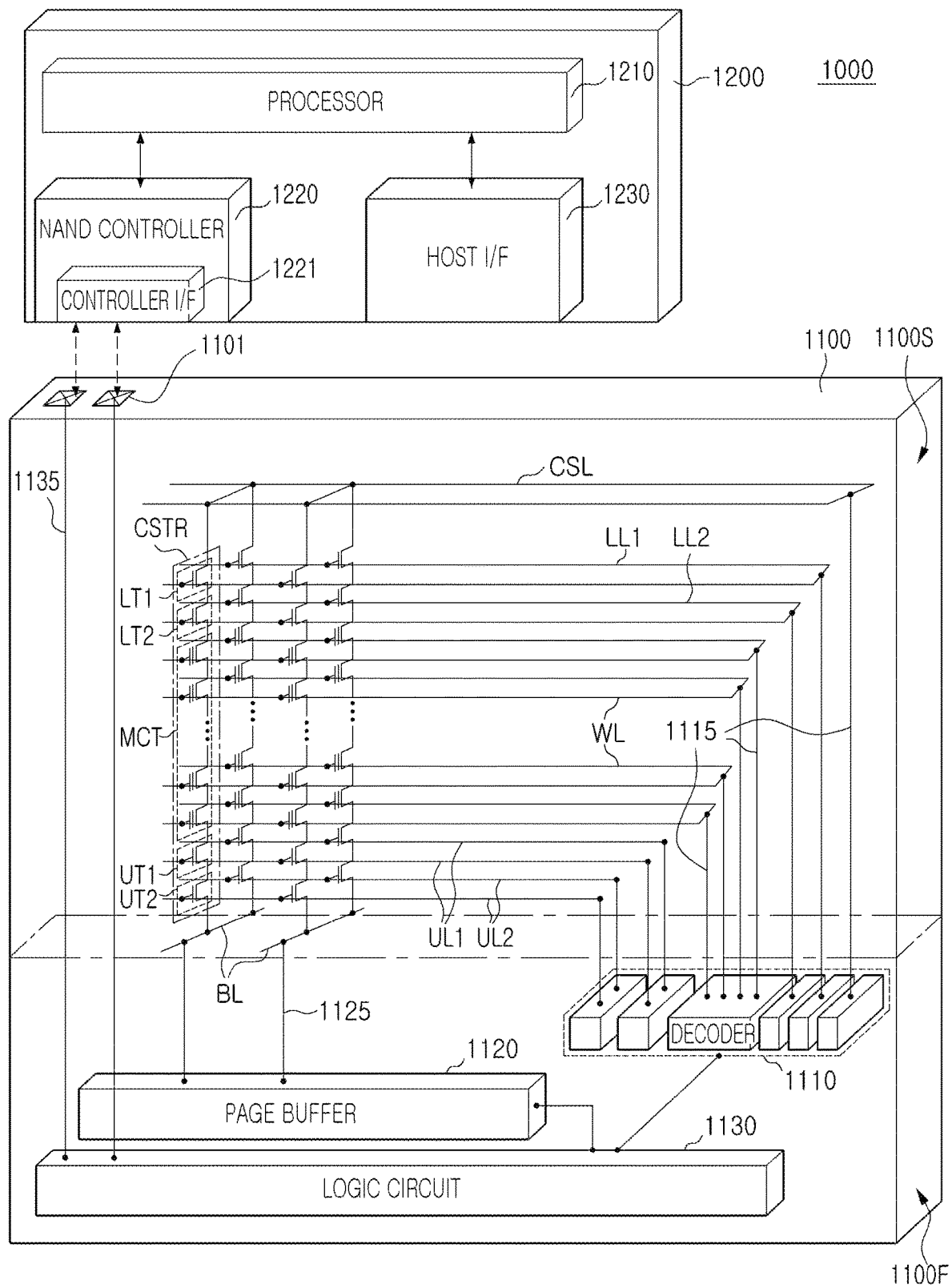
FIG. 17 is a diagram schematically illustrating a data storage system including a semiconductor device according to example embodiments.

FIG. 17 is a diagram schematically illustrating a data storage system including a semiconductor device according to example embodiments. Referring to FIG. 17, the data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD) including one or a plurality of semiconductor devices 1100, a universal serial bus (USB), a computing system, a medical device, or a communication device.

The semiconductor device 1100 may be a nonvolatile memory device, for example, the NAND flash memory device described above with reference to FIGS. 1 to 5B. The semiconductor device 1100 may include a first semiconductor structure 1100F and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S includes a bit line BL, a common source line CSL, word lines WL, first and second gate upper lines UL1 and UL2, and first and second gate lower portions. The memory cell structure may include lines LL1 and LL2 and memory cell strings CSTR between the bit line BL and the common source line CSL.

In the second semiconductor structure 1100S, each of the memory cell strings CSTR includes lower transistors LT1 and LT2 adjacent to the common source line CSL and upper transistors UT1 adjacent to the bit line BL, UT2, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using the GIDL phenomenon.

The common source line CSL, the first and second gate lower lines LL1 and LL2, the word lines WL, and the first and second gate upper lines UL1 and UL2 may be electrically connected to the decoder circuit 1110 through first connection lines 1115 extending from the inside of the first semiconductor structure 1100F to the second semiconductor structure 1100S. The bit lines BL may be electrically connected to the page buffer 1120 through second connection lines 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the first semiconductor structure 1100F to the second semiconductor structure 1100S.

The controller 1200 may include a processor 1210, a NAND controller 1220, and a host interface 1230. In some embodiments, the data storage system 1000 may include a plurality of semiconductor devices 1100, and in this case, the controller 1200 may control the plurality of semiconductor devices 1000.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the memory cell transistors MCT of the semiconductor device 1100, data to be read from the memory cell transistors MCT of the semiconductor device 1100, and the like may be transmitted. The host interface 1230 may provide a communication function between the data storage system 1000 and an external host. When receiving a control command from an external host through the host interface 1230, the processor 1210 may control the semiconductor device 1100 in response to the control command.

Figure 18:
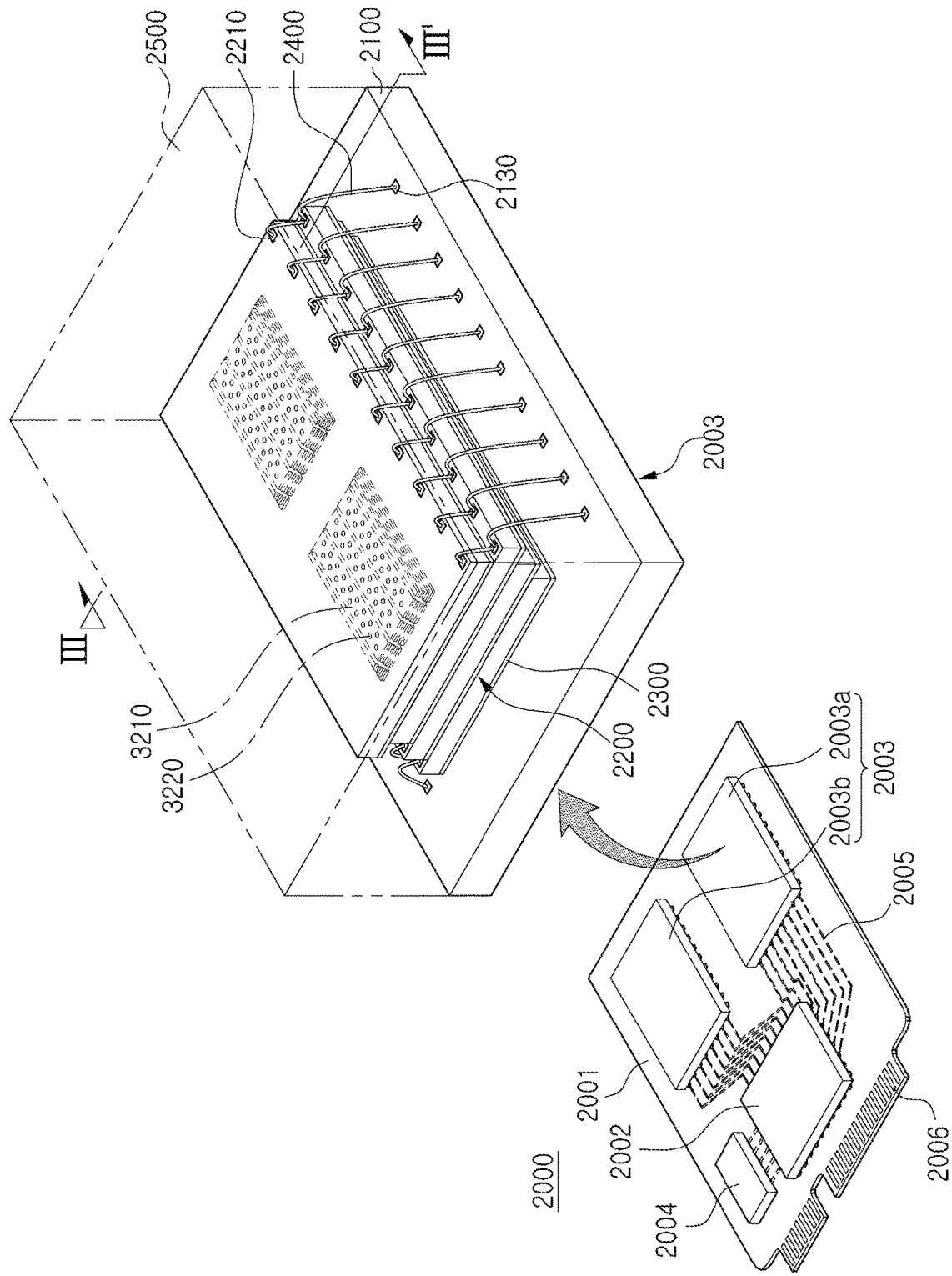
FIG. 18 is a perspective view schematically illustrating a data storage system including a semiconductor device according to an example embodiment.

FIG. 18 is a perspective view schematically illustrating a data storage system including a semiconductor device according to an example embodiment. Referring to FIG. 18, a data storage system 2000 according to an example embodiment includes a main board 2001, a controller 2002 mounted on the main board 2001, one or more semiconductor packages 2003, and DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may include an M-Phy for Universal Serial Bus (USB), Peripheral Component Interconnect Express (PCI-Express), Serial Advanced Technology Attachment (SATA), Universal Flash Storage (UFS), etc. and communicate with an external host according to any one of the interfaces of In example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the data storage system 2000. The DRAM 2004 may be a buffer memory for mitigating a speed difference between the semiconductor package 2003 as a data storage space and an external host. The DRAM 2004 included in the data storage system 2000 may operate as a kind of cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include the package substrate 2100, the semiconductor chips 2200 on the package substrate 2100, and adhesive layers 2300 disposed on lower surfaces of the semiconductor chips 2200, respectively, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 17, and may be a region including the pad layer 230 of FIG. 2A. Each of the semiconductor chips 2200 may include gate stack structures 3210 and channel structures 3220. Each of the semiconductor chips 2200 may include the semiconductor device described above with reference to FIGS. 1 to 5B.

In example embodiments, the connection structure 2400 may be a bonding wire electrically connecting the input/output pad 2210 and the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100 and may be electrically connected. According to embodiments, in each of the first and second semiconductor packages 2003a and 2003b, the semiconductor chips 2200 may be electrically connected to each other by a connection structure including a through-electrode (TSV) instead of the bonding wire-type connection structure 2400.

In example embodiments, the controller 2002 and the semiconductor chips 2200 may be included in one package. In an example embodiment, the controller 2002 and the semiconductor chips 2200 are mounted on a interposer substrate different from the main substrate 2001, and the controller 2002 and the semiconductor chips 2200 may be connected to each other by interconnection structure formed in the interposer substrate.

Figure 19:
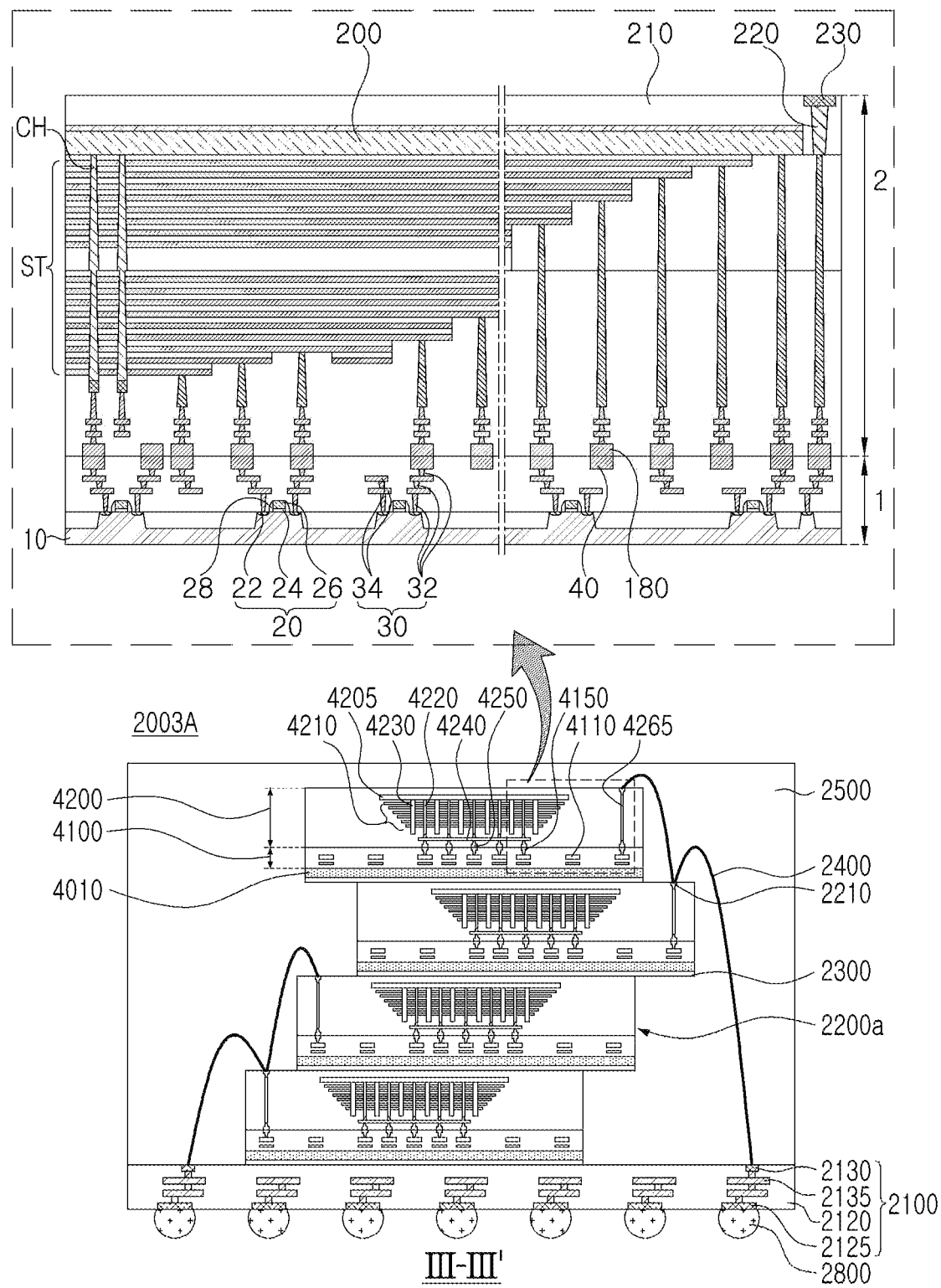
FIG. 19 is a cross-sectional view schematically illustrating a semiconductor package according to an example embodiment.

FIG. 19 is a cross-sectional view schematically illustrating a semiconductor package according to an example embodiment. 19 illustrates an example embodiment of the semiconductor package 2003 of FIG. 18, and conceptually illustrates a region cut along the cutting line III-Ill' of the semiconductor package 2003 of FIG. 18. Referring to FIG. 19, in the semiconductor package 2003, the package substrate 2100 may be a printed circuit board. The package substrate 2100 may include a package substrate body 2120, the package upper pads 2130 (refer to FIG. 18) disposed on the upper surface of the package substrate body 2120, and the lower surface of the package substrate body 2120, lower pads 2125 exposed through the lower surface or through the lower surface, and internal interconnections 2135 electrically connecting the upper pads 2130 and the lower pads 2125 in the package substrate body 2120. The upper pads 2130 may be electrically connected to the connection structures 2400. The lower pads 2125 may be connected to the interconnection patterns 2005 of the main board 2010 of the data storage system 2000 as illustrated in FIG. 18 through conductive connectors 2800.

Each of the semiconductor chips 2200 may include a semiconductor substrate 4010 and a first semiconductor structure 4100 and a second semiconductor structure 4200 that are sequentially stacked on the semiconductor substrate 4010. The first semiconductor structure 4100 may include a peripheral circuit region including peripheral interconnections 4110 and first bonding structures 4150. The second semiconductor structure 4200 may include a common source line 4205, a gate stack structure 4210 on the common source line 4205, channel structures 4220 and separation regions 4230 penetrating through the gate stack structure 4210, bit lines 4240 electrically connected to the memory channel structures 4220, contact plugs ('160g' of FIG. 2A) electrically connected to the word lines WL (refer to FIG. 17) of the gate stack structure 4210, and second bonding structures 4250. The first bonding structures 4150 of the first structure 4100 and the second bonding structures 4250 of the second structure 4200 may be bonded while being in contact with each other. Bonded portions of the first bonding structures 4150 and the second bonding structures 4250 may be formed of, for example, copper (Cu).

As described above with reference to FIGS. 1 to 5b, a plate layer 200 may be disposed on the stacked structure ST in each of the semiconductor chips 2200, the upper surfaces 140a and 140b of the channel layer 140 of the channel structure CH, the upper surfaces 145a and 145b of the gate dielectric layer 145 and the upper surface 147u of the core insulating layer 147 may be in contact with the plate layer 200, and a region adjacent to the upper surfaces 140a and 140 of the channel layer 140 may include polycrystalline silicon doped with an N conductivity type.

Each of the semiconductor chips 2200 may include a through interconnection 4245 electrically connected to the peripheral interconnections 4110 of the first semiconductor structure 4100 and extending into the second semiconductor structure 4200. The through interconnection 4245 may be disposed outside the gate stack structure 4210, and may be further disposed to pass through the gate stack structure 4210. Each of the semiconductor chips 2200 may further include an input/output pad 2210 (refer to FIG. 18) electrically connected to the peripheral wires 4110 of the first semiconductor structure 4100, and the input/output pad 2210 may be a region including the pad layer 230.

As set forth above, according to example embodiments, after bonding the peripheral circuit region and the memory cell region with bonding pads, an ion implantation process is performed by exposing one end of the channel structure, such that a doped region of the channel layer may be controlled. Therefore, a semiconductor device having improved electrical characteristics and productivity and a data storage system including the same may be provided.

By disposing the string separation structure and the channel structure to overlap each other, a semiconductor device having improved integration by densely disposing the channel structures and a data storage system including the same may be provided.

While example embodiments have been illustrated and described above, it will be apparent to those skilled in the art that modifications and variations could be made without departing from the scope of the present inventive concept as defined by the appended claims.

What is claimed is:

1. A semiconductor storage device, comprising:
   a first structure including a substrate, circuit elements on the substrate, a lower interconnection structure electrically connected to the circuit elements, and lower bonding pads, which are electrically connected to the lower interconnection structure; and
   a second structure on the first structure, said second structure comprising:
   a stack structure including gate electrodes and interlayer insulating layers, which are alternately stacked and spaced apart in a vertical direction;
   a plate layer, which extends on the stack structure and covers at least a portion of an upper surface of the stack structure;
   channel structures, which penetrate at least partially through the stack structure, said channel structures respectively including a channel layer extending in the vertical direction and connected to the plate layer, a gate dielectric layer surrounding an outer side surface of the channel layer, and a core insulating layer covering an inner side surface of the channel layer;

separation regions, which penetrate at least partially through the stack structure, extend in a first direction, and separate the gate electrodes in a second direction perpendicular to the first direction; and upper bonding pads, which are electrically connected to the gate electrodes and the channel structures, and are bonded to corresponding ones of the lower bonding pads;

wherein based on an upper surface of the substrate, an upper surface of the channel layer and an upper surface of the gate dielectric layer are in contact with the plate layer, on a level higher than an uppermost gate electrode, among the gate electrodes; and wherein the second structure further includes a base layer, which comprises a semiconductor material, extends between the plate layer and the stack structure, and at least partially surrounds an outer side surface of the gate dielectric layer.

2. The semiconductor storage device of claim 1, wherein the channel layer comprises a semiconductor material; and wherein at least a portion of the channel layer that overlaps the uppermost gate electrode in a horizontal direction is doped with an N-type impurity.

3. The semiconductor storage device of claim 2, wherein each of the channel structures further includes a channel pad covering a lower surface of the channel layer and a lower surface of the core insulating layer; wherein the channel pad comprises a semiconductor material and impurities; and wherein at least a portion of the channel layer horizontally overlaps a lowest gate electrode, among the gate electrodes, and includes an impurity of the same conductivity type as the impurities of the channel pad.

4. The semiconductor storage device of claim 1,
wherein the second structure further comprises a string separation region, which penetrates through at least one lower gate electrode including a lowermost gate electrode, among the gate electrodes, and between the separation regions;
wherein the string separation region is configured to overlap at least one of the channel structures in the vertical direction; and
wherein the string separation region is in contact with the channel layer and the core insulating layer of the at least one channel structure.

5. The semiconductor storage device of claim 4, wherein the at least one channel structure has an asymmetrical cross-section.

6. The semiconductor storage device of claim 4, wherein relative to the upper surface of the substrate, a level of a lower surface of the channel structure is higher than a level of a lower surface of the separation region, and the level of the lower surface of the separation region is higher than a level of a lower surface of the string separation region.

7. The semiconductor storage device of claim 1, wherein the upper surface of the channel layer and the upper surface of the gate dielectric layer are located on substantially the same level.

8. The semiconductor storage device of claim 1, wherein each of the channel structures has an extension region extending within the base layer in a width direction.

9. The semiconductor storage device of claim 8, wherein the plate layer includes a protrusion portion, which extends downwardly to be lower than the base layer, covers the inner side surface of the channel layer, and contacts the upper surface of the core insulating layer.

10. The semiconductor storage device of claim 1,
wherein the stack structure includes a lower stack structure, which includes lower gate electrodes among the gate electrodes, and an upper stack structure, which includes upper gate electrodes among the gate electrodes, on the lower stack structure; and
wherein each of the channel structures has a bent portion on a level between an uppermost gate electrode of the lower gate electrodes and a lowermost gate electrode of the upper gate electrodes.

11. A semiconductor storage device, comprising:
a first structure including a substrate, circuit elements on the substrate, a lower interconnection structure electrically connected to the circuit elements, and lower bonding pads electrically connected to the lower interconnection structure; and
a second structure on the first structure, said second structure comprising:
a plate layer on the first structure;
a stack structure, which includes gate electrodes stacked to be spaced apart from each other in a vertical direction, extending between the plate layer and the first structure;
channel structures disposed in channel holes, which at least partially penetrate through the stack structure, respectively; and
upper bonding pads, which are electrically connected to the gate electrodes and the channel structures, and are bonded to corresponding ones of the lower bonding pads;
wherein each of the channel structures includes a channel layer having an inner hole penetrating through an upper surface and a lower surface in the vertical direction, a core insulating layer in the inner hole of the channel layer, and a gate dielectric layer surrounding an outer side surface of the channel layer;
wherein the upper surface of the channel layer and an upper surface of the gate dielectric layer are in contact with the plate layer; and
wherein the second structure further comprises a base layer, which comprises a semiconductor material, extends between the plate layer and the stack structure, and is penetrated by the channel structures.

12. The semiconductor storage device of claim 11, wherein each of the channel structures further comprises a channel pad, which covers the lower surface of the channel layer and a lower surface of the core insulating layer, said channel pad comprising a semiconductor material and impurities; and wherein within the channel layer, a region extending from the lower surface of the channel layer to a depth thereof overlapping at least one lower gate electrode of the gate electrodes in a horizontal direction, includes polysilicon doped with the same conductivity type impurity as the channel pad.

13. The semiconductor storage device of claim 11, wherein in the inner hole of the channel layer, an upper surface of the core insulating layer is in contact with the plate layer.

14. The semiconductor storage device of claim 11, wherein an upper surface of the gate dielectric layer is located on substantially the same level as the upper surface of the channel layer.

15. The semiconductor storage device of claim 12, wherein the plate layer includes a protrusion portion protruding into the inner hole of the channel layer and in contact with an inner side surface of the channel layer.

16. The semiconductor storage device of claim 11, wherein each of the channel structures has an extension region extending in a width direction in the base layer.

17. The semiconductor storage device of claim 16, wherein in the extension region, the inner hole of the channel layer includes an expansion hole extending in the width direction; and wherein the plate layer includes a protrusion portion protruding into the expansion hole and contacting the channel layer.

18. A data storage system, comprising:
a semiconductor storage device including: (i) a first structure including a substrate, (ii) a second structure on the first structure, and (iii) an input/output pad electrically connected to circuit elements on the substrate, (iv) a lower interconnection structure electrically connected to the circuit elements, and (v) lower bonding pads electrically connected to the lower interconnection structure; and
a controller electrically connected to the semiconductor storage device through the input/output pad, said controller configured to control the semiconductor storage device;
wherein the second structure includes:
a plate layer on the first structure;
a stack structure, including gate electrodes stacked to be spaced apart from each other in a vertical direction, between the plate layer and the first structure;
channel structures, which are provided in channel holes and at least partially penetrate through the stack structure; and
upper bonding pads electrically connected to the gate electrodes and the channel structures and bonded to corresponding ones of the lower bonding pads;
wherein each of the channel structures includes a channel layer having an inner hole, which penetrates through an upper surface and a lower surface in the vertical direction, a core insulating layer extending in the inner hole of the channel layer, and a gate dielectric layer surrounding an outer side surface of the channel layer;
wherein the upper surface of the channel layer and an upper surface of the gate dielectric layer are in contact with the plate layer;
wherein in the channel layer, a region extending from the upper surface of the channel layer to a depth thereof overlaps at least one upper gate electrode of the gate electrodes in a horizontal direction, and includes polysilicon doped with an N-type impurity; and
wherein the second structure further comprises a base layer, which comprises a semiconductor material, extends between the plate layer and the stack structure, and is penetrated by the channel structures.

19. The data storage system of claim 18, wherein each of the channel structures further includes a channel pad covering the lower surface of the channel layer and a lower surface of the core insulating layer; wherein the channel pad includes a semiconductor material and impurities; and wherein within the channel layer, a region, which extends from the lower surface of the channel layer to a depth thereof and overlaps at least one lower gate electrode of the gate electrodes in the horizontal direction, includes polysilicon doped with the same conductivity type as a conductivity type of the channel pad.

20. The data storage system of claim 18, wherein relative to an upper surface of the substrate, an upper surface of the channel layer and an upper surface of the gate dielectric layer are in contact with the plate layer on a level higher than an uppermost gate electrode, among the gate electrodes; and wherein an upper surface of the core insulating layer is in contact with the plate layer, and is located on substantially the same level as or a level lower than the upper surface of the channel layer.

* * * * *